(12) United States Patent
Ramachandran et al.

(10) Patent No.: US 8,536,656 B2
(45) Date of Patent: Sep. 17, 2013

(54) SELF-ALIGNED CONTACTS FOR HIGH K/METAL GATE PROCESS FLOW

(75) Inventors: Ravikumar Ramachandran, Pleasantville, NY (US); Ramachandra Divakaruni, Ossining, NY (US); Ying Li, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 125 days.

(21) Appl. No.: 12/987,221

(22) Filed: Jan. 10, 2011

(65) Prior Publication Data

US 2012/0175711 A1    Jul. 12, 2012

(51) Int. Cl.
*H01L 21/70* (2006.01)

(52) U.S. Cl.
USPC ........... 257/383; 257/411; 257/410; 257/347; 257/282; 257/72; 257/302; 257/77; 257/369; 438/586; 438/785; 438/243; 438/653; 438/681

(58) Field of Classification Search
USPC ............... 257/383, 411, 410, 347, 382, 72, 257/302, 77, 369; 438/586, 785, 243, 653, 438/681
See application file for complete search history.

(56) References Cited

U.S. PATENT DOCUMENTS

| | | | | | |
|---|---|---|---|---|---|
| 5,920,098 | A | * | 7/1999 | Liaw | 257/383 |
| 5,990,493 | A | * | 11/1999 | Gardner et al. | 257/77 |
| 6,037,228 | A | * | 3/2000 | Hsu | 438/279 |
| 6,258,659 | B1 | * | 7/2001 | Gruening et al. | 438/243 |
| 6,333,247 | B1 | * | 12/2001 | Chan et al. | 438/586 |
| 6,617,654 | B2 | * | 9/2003 | Oishi et al. | 257/382 |
| 6,927,461 | B2 | * | 8/2005 | Kim et al. | 257/382 |
| 7,023,055 | B2 | | 4/2006 | Ieong et al. | |
| 7,081,409 | B2 | * | 7/2006 | Kang et al. | 438/681 |
| 7,329,923 | B2 | | 2/2008 | Doris et al. | |
| 7,550,773 | B2 | * | 6/2009 | Booth, Jr. et al. | 257/72 |
| 7,833,855 | B2 | * | 11/2010 | Kang et al. | 438/199 |
| 8,048,790 | B2 | * | 11/2011 | Soss et al. | 438/585 |
| 8,178,928 | B2 | * | 5/2012 | Shin et al. | 257/368 |
| 8,288,296 | B2 | * | 10/2012 | Wong et al. | 438/785 |
| 2004/0235285 | A1 | * | 11/2004 | Kang et al. | 438/597 |
| 2005/0116290 | A1 | | 6/2005 | de Souza et al. | |
| 2005/0186747 | A1 | * | 8/2005 | Amos et al. | 438/301 |
| 2006/0240665 | A1 | * | 10/2006 | Kang et al. | 438/653 |
| 2008/0169494 | A1 | * | 7/2008 | Cheng et al. | 257/302 |

(Continued)

*Primary Examiner* — Fernando L Toledo
*Assistant Examiner* — Mohammed Shamsuzzaman
(74) *Attorney, Agent, or Firm* — Scully, Scott, Murphy & Presser, P.C.; H. Daniel Schnurmann

(57) ABSTRACT

A semiconductor structure is provided that includes a semiconductor substrate having a plurality of gate stacks located on a surface of the semiconductor substrate. Each gate stack includes, from bottom to top, a high k gate dielectric layer, a work function metal layer and a conductive metal. A spacer is located on sidewalls of each gate stack and a self-aligned dielectric liner is present on an upper surface of each spacer. A bottom surface of each self-aligned dielectric liner is present on an upper surface of a semiconductor metal alloy. A contact metal is located between neighboring gate stacks and is separated from each gate stack by the self-aligned dielectric liner. The structure also includes another contact metal having a portion that is located on and in direct contact with an upper surface of the contact metal and another portion that is located on and in direct contact with the conductive metal of one of the gate stacks. Methods of forming the semiconductor structure using a replacement gate and a non-replacement gate scheme are also disclosed.

14 Claims, 17 Drawing Sheets

(56) References Cited

U.S. PATENT DOCUMENTS

| | | | |
|---|---|---|---|
| 2008/0272410 A1* | 11/2008 | Lin | 257/288 |
| 2009/0001464 A1* | 1/2009 | Booth, Jr. et al. | 257/347 |
| 2010/0052075 A1* | 3/2010 | Yeh et al. | 257/410 |
| 2010/0164008 A1* | 7/2010 | Mehrad et al. | 257/369 |
| 2011/0079851 A1* | 4/2011 | Li et al. | 257/347 |
| 2011/0156107 A1* | 6/2011 | Bohr et al. | 257/288 |
| 2011/0298061 A1* | 12/2011 | Siddiqui et al. | 257/410 |
| 2012/0045889 A1* | 2/2012 | Yeh et al. | 438/586 |
| 2012/0068234 A1* | 3/2012 | Soss et al. | 257/288 |
| 2012/0139015 A1* | 6/2012 | Yu et al. | 257/288 |
| 2012/0139061 A1* | 6/2012 | Ramachandran et al. | 257/410 |
| 2012/0139062 A1* | 6/2012 | Yuan et al. | 257/411 |
| 2012/0146148 A1* | 6/2012 | Iwamatsu | 257/351 |
| 2012/0153398 A1* | 6/2012 | Baars et al. | 257/369 |

* cited by examiner

SELF-ALIGNED CONTACTS FOR HIGH K/METAL GATE PROCESS FLOW

BACKGROUND

The present disclosure relates to a semiconductor structure and a method of fabricating the same. More particularly, the present disclosure relates to a semiconductor structure including at least one high dielectric constant (k)/metal gate stack having self-aligned contacts and a method of fabricating such a structure.

As semiconductor devices shrink in each generation of semiconductor technology, formation of contact structures to source and drain regions of a field effect transistor become challenging because such contact structures not only need to provide reliable electrical contact to the source and drain regions, but also need to avoid electrically shorting to other components such as the gate electrode of the field effect transistor. Since the etch chemistry employed for the anisotropic etch process remains the same while the lateral dimension of the dielectric gate spacer shrinks with the scaling of semiconductor devices, the likelihood of overlay variations during lithographic processes causing formation of contact structures that electrically short a source/drain region to a gate conductor of a field effect transistor increases in each generation.

Nonetheless, contact structures to source and drain regions must avoid electrically shorting to gate conductors to provide a functional field effect transistor. Thus, the possibility of electrically shorting source/drain regions to a gate conductor of a field effect transistor is a significant concern for product yield and reliability purposes.

SUMMARY

A semiconductor structure including a self-aligned contact is disclosed in the present application. The semiconductor structure includes a semiconductor substrate having a plurality of gate stacks located on a surface of the semiconductor substrate. Each gate stack includes, from bottom to top, a high k gate dielectric layer, a work function metal layer and a conductive metal. In one embodiment, the high k gate dielectric layer and the work function metal layer are both U-shaped. A spacer is located on sidewalls of each gate stack and a self-aligned dielectric liner is present on an upper surface of each spacer. A bottom surface of each self-aligned dielectric liner is present on an upper surface of a semiconductor metal alloy. A contact metal is located between neighboring gate stacks and is separated from each gate stack by the self-aligned dielectric liner. The structure also includes another contact metal having a portion that is located on and in direct contact with an upper surface of the contact metal and another portion that is located on and in direct contact with the conductive metal of one of the gate stacks.

The present disclosure also provides a method of forming such a semiconductor structure. The method includes providing a structure including a plurality of gate stacks located on a surface of a semiconductor substrate. Each gate stack includes a spacer located on a vertical sidewall thereof, and a metal semiconductor alloy layer is located on an exposed surface of the semiconductor substrate between neighboring gate stacks. A self-aligned dielectric liner is formed on exposed surfaces of each gate stack, the spacer and the metal semiconductor alloy layer. A planarized dielectric material having a contact opening that is partially filled with a recessed contact metal is then formed. During this step, portions of the self-aligned dielectric liner are removed from horizontal surfaces within the contact opening. Another contact metal having a first portion that is located on and in direct contact with an upper surface of the recessed contact metal and a second portion that is located on and in direct contact with a conductive metal of one of the gate stack is formed.

DETAILED DESCRIPTION

Figure 1:
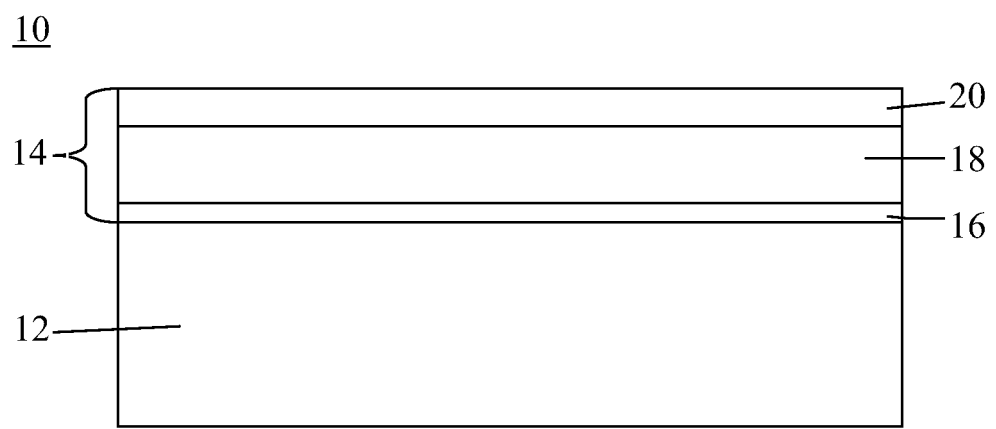
FIG. 1 is a pictorial representation (through a cross sectional view) depicting an initial structure including a sacrificial material stack located on an upper surface of a semiconductor substrate that can be employed in one embodiment of the present disclosure.

The present disclosure, which provides a semiconductor structure including at least one high k/metal gate stack having self-aligned contacts and a method of fabricating such a structure, will now be described in greater detail by referring to the following discussion and drawings that accompany the present application. It is noted that the drawings are provided for illustrative purposes only and are not drawn to scale.

In the following description, numerous specific details are set forth, such as particular structures, components, materials, dimensions, processing steps and techniques, in order to illustrate the present disclosure. However, it will be appreciated by one of ordinary skill in the art that various embodiments of the present disclosure may be practiced without these, or with other, specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present disclosure provides a semiconductor structure including at least one high k/metal gate stack having self-aligned contacts and a method of fabricating such a structure. In one embodiment of the present disclosure, the self-aligned contacts are formed prior to performing a replacement gate process. In another embodiment, the self-aligned contacts are formed prior to forming a gate metal silicide in a gate first process flow. The various embodiments mentioned above will now be described in greater detail.

Reference is first made to FIGS. 1-18 which illustrate the formation of self-aligned contacts prior to performing a replacement gate process. This embodiment of the present disclosure begins by providing the initial structure 10 that is shown, for example, in FIG. 1. Specifically, the initial structure of FIG. 1 includes a sacrificial material stack 14 located on an upper surface of a semiconductor substrate 12.

In some embodiments of the present disclosure, the semiconductor substrate 12 is a bulk semiconductor substrate.

When a bulk semiconductor substrate is employed as semiconductor substrate 12, the bulk semiconductor substrate is comprised of any semiconductor material including, but not limited to, Si, Ge, SiGe, SiC, SiGeC, InAs, GaAs, InP or other like III/V compound semiconductors. Multilayers of these semiconductor materials can also be used as the semiconductor material of the bulk semiconductor. In one embodiment, the bulk semiconductor substrate is comprised of Si.

In another embodiment, a semiconductor-on-insulator (SOI) substrate (not specifically shown) is employed as the semiconductor substrate 12. When employed, the SOI substrate includes a handle substrate, a buried insulating layer located on an upper surface of the handle substrate, and a semiconductor layer located on an upper surface of the buried insulating layer. The handle substrate and the semiconductor layer of the SOI substrate may comprise the same, or different, semiconductor material. The term "semiconductor" as used herein in connection with the semiconductor material of the handle substrate and the semiconductor layer denotes any semiconducting material including, for example, Si, Ge, SiGe, SiC, SiGeC, InAs, GaAs, InP or other like III/V compound semiconductors. Multilayers of these semiconductor materials can also be used as the semiconductor material of the handle substrate and the semiconductor layer. In one embodiment, the handle substrate and the semiconductor layer are both comprised of Si. In another embodiment, hybrid SOI substrates are employed which have different surface regions of different crystallographic orientations.

The handle substrate and the semiconductor layer may have the same or different crystal orientation. For example, the crystal orientation of the handle substrate and/or the semiconductor layer may be {100}, {110}, or {111}. Other crystallographic orientations besides those specifically mentioned can also be used in the present disclosure. The handle substrate and/or the semiconductor layer of the SOI substrate may be a single crystalline semiconductor material, a polycrystalline material, or an amorphous material. Typically, at least the semiconductor layer is a single crystalline semiconductor material.

The buried insulating layer of the SOI substrate may be a crystalline or non-crystalline oxide or nitride. In one embodiment, the buried insulating layer is an oxide. The buried insulating layer may be continuous or it may be discontinuous. When a discontinuous buried insulating region is present, the insulating region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

The thickness of the semiconductor layer of the SOI substrate is typically from 100 Å to 1000 Å, with a thickness from 500 Å to 700 Å being more typical. In some embodiments, and when an ETSOI (extremely thin semiconductor-on-insulator) substrate is employed, the semiconductor layer of the SOI has a thickness of less than 100 Å. If the thickness of the semiconductor layer is not within one of the above mentioned ranges, a thinning step such as, for example, planarization or etching can be used to reduce the thickness of the semiconductor layer to a value within one of the ranges mentioned above.

The buried insulating layer of the SOI substrate typically has a thickness from 10 Å to 2000 Å, with a thickness from 1000 Å to 1500 Å being more typical. The thickness of the handle substrate of the SOI substrate is inconsequential to the present disclosure.

In some other embodiments, hybrid semiconductor substrates which have different surface regions of different crystallographic orientations can be employed as semiconductor substrate 12. When a hybrid substrate is employed, an nFET is typically formed on a (100) crystal surface, while a pFET is typically formed on a (110) crystal plane. The hybrid substrate can be formed by techniques that are well known in the art. See, for example, U.S. Pat. No. 7,329,923, U.S. Publication No. 2005/0116290, dated Jun. 2, 2005 and U.S. Pat. No. 7,023,055, the entire contents of each are incorporated herein by reference.

The semiconductor substrate 12 may be doped, undoped or contain doped and undoped regions therein. For clarity, the doped regions are not specifically shown in the drawings of the present application. Each doped region within the semiconductor substrate 12 may have the same, or they may have different conductivities and/or doping concentrations. The doped regions that are present in the semiconductor substrate 12 are typically referred to as well regions and they are formed utilizing a conventional ion implantation process or gas phase doping.

The semiconductor substrate 12 can be processed to include at least one isolation region therein. For clarity, the at least one isolation region is not shown in the drawings of the present disclosure. The at least one isolation region can be a trench isolation region or a field oxide isolation region. The trench isolation region can be formed utilizing a conventional trench isolation process well known to those skilled in the art. For example, lithography, etching and filling of the trench with a trench dielectric such as an oxide may be used in forming the trench isolation region. Optionally, a liner may be formed in the trench prior to trench fill, a densification step may be performed after the trench fill and a planarization process may follow the trench fill as well. The field oxide isolation region may be formed utilizing a so-called local oxidation of silicon process. Note that the at least one isolation region provides isolation between neighboring gate regions, typically required when the neighboring gates have opposite conductivities, i.e., nFETs and pFETs. As such, the at least one isolation region separates an nFET device region from a pFET device region.

As mentioned above, a sacrificial (or disposable) material stack 14 is formed on an upper surface of the semiconductor substrate 12. As shown, the sacrificial material stack 14 includes, from bottom to top, a sacrificial dielectric layer 16, a sacrificial gate material layer 18, and a hard mask material layer 20.

The sacrificial dielectric layer 16 comprises any dielectric material including, for example, a semiconductor oxide such as silicon oxide, silicon nitride, and silicon oxynitride. The sacrificial dielectric layer 16 is formed as a blanket layer over the upper surface of the semiconductor substrate 12 utilizing any conventional deposition process including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), and other like deposition processes. In some embodiments of the present disclosure, the sacrificial dielectric layer 16 is formed utilizing a thermal growth process including, for example, oxidation and nitridation. The thickness of the sacrificial dielectric layer 16 may vary depending on the type of dielectric material employed as well as the technique that was used in forming the same. Typically, and by way of an example, the sacrificial dielectric layer 16 has a thickness from 1 nm to 5 nm. More typically, the sacrificial dielectric layer 16 has a thickness from 1 nm to 3 nm.

The sacrificial gate material layer 18, which is located on an upper surface of the sacrificial dielectric layer 16, includes any material (doped or non-doped) that can be subsequently removed selective to dielectric material. In one embodiment, the sacrificial gate material layer 18 is composed of a semiconductor material such as, for example, polysilicon. The sacrificial gate material layer 18 can be formed utilizing any deposition process including, for example, chemical vapor deposition (CVD), plasma enhanced chemical vapor deposition (PECVD), evaporation, physical vapor deposition (PVD), sputtering, chemical solution deposition, and atomic layer deposition (ALD). When a doped sacrificial gate material layer 18 is employed, the dopant can be introduced in-situ during the deposition process. Alternatively, the dopant can be introduced following the deposition by any suitable doping technique such as, for example, ion implantation and gas phase doping. The thickness of the sacrificial gate material layer 18 may vary depending on the type of sacrificial material employed as well as the technique that was used in forming the same. Typically, and by way of an example, the sacrificial gate material layer 18 has a thickness from 20 nm to 100 nm. More typically, the sacrificial gate material layer 18 has a thickness from 30 nm to 60 nm.

The hard mask material layer 20 is comprised of a dielectric material including, for example, silicon oxide, silicon nitride, silicon oxynitride or multilayered stacks thereof. The hard mask material layer 20 can be formed utilizing any conventional deposition process including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), and other like deposition processes. In some embodiments of the present disclosure, the hard mask material layer 20 is formed utilizing a thermal growth process including, for example, oxidation and nitridation. The thickness of the hard mask material layer 20 may vary depending on the type of dielectric material employed as well as the technique that was used in forming the same. Typically, and by way of an example, the hard mask material layer 20 has a thickness from 20 nm to 100 nm. More typically, the hard mask layer 20 has a thickness from 30 nm to 50 nm.

In some embodiments of the present disclosure, the hard mask material layer 20 can be omitted. In such an embodiment, the sacrificial gate material layer 18 is composed of a material that will not be converted into a metal semiconductor alloy during a subsequent metal semiconductor alloy formation process. An example of such a material is a metal.

Figure 2:
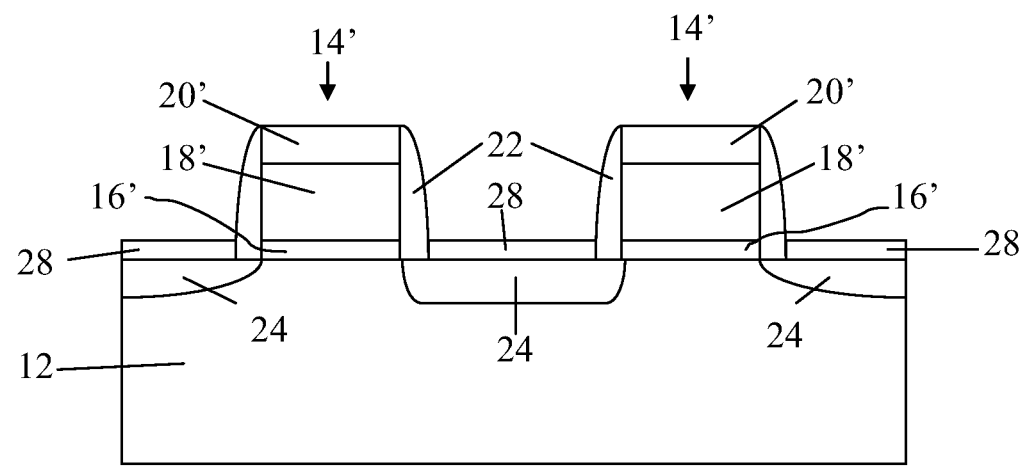
FIG. 2 is a pictorial representation (through a cross sectional view) depicting the initial structure of FIG. 1 after patterning the sacrificial material stack, forming a spacer on the sidewalls of each patterned sacrificial material stack formed, and after forming a metal semiconductor alloy on an exposed upper surface of the semiconductor substrate.

Referring now to FIG. 2, there is illustrated the initial structure of FIG. 1 after patterning the sacrificial material stack 14 into a plurality of patterned sacrificial material stacks 14', forming a spacer 22 on the sidewalls of each patterned sacrificial material stack 14', forming a source region and a drain region (hereinafter collectively referred to as source/drain regions 24), and after forming a metal semiconductor alloy 28 on an exposed upper surface of the semiconductor substrate 12. It is noted that although one of the source/drain regions is shown as a common diffusion region for both of the illustrated patterned sacrificial material stack 14', the present disclosure also contemplates an embodiment in which an isolation region is present in the middle of the common source/drain region shown in the drawings.

The patterning of the sacrificial material stack 14 includes lithography and etching. The lithography includes forming a photoresist material (not shown) on an upper surface of the sacrificial material stack 14, exposing the photoresist to a desired pattern of radiation and developing the exposed resist using a conventional resist developer. The etching step can include a dry etching process, a wet etching process or a combination thereof. When a dry etching process is employed, the dry etching process can include one of reactive ion etching, ion beam etching, plasma etching and laser ablation. When a wet etching process is employed, a chemical etchant that is selective to the underlying materials of the sacrificial material stack 14 is employed. The patterned resist that is formed can remain on the sacrificial material stack 14 during the etching process. Alternatively, the patterned resist that is formed can be removed after transferring the pattern into a least the hard mask material layer 20. The removal of the patterned resist can be achieved using any conventional resist stripping process such as, for example, ashing. Each patterned sacrificial material stack includes, from bottom to top, patterned sacrificial dielectric layer 16', patterned sacrificial gate material 18' and patterned hard mask 20'.

After forming the plurality of patterned material stacks 14', a spacer 22 is formed on the sidewalls of each patterned sacrificial material stack 14'. The spacer 22 that is formed is comprised of a dielectric material such as, for example, silicon oxide, silicon nitride or silicon oxynitride. In one embodiment, the spacer 22 is comprised of silicon nitride. In some embodiments, the spacer 22 may include a multilayered stack of such dielectric materials. The spacer 22 can be formed by deposition of a conformal dielectric material layer, followed by anisotropic etching.

The source/drain regions 24 are typically formed into exposed portions of the semiconductor substrate 12 after forming the spacer 22. The source/drain regions 24 can be formed utilizing any conventional source/drain ion implantation process. An activation anneal may follow the formation of the source/drain regions 24. In some embodiments, and prior to spacer formation, source/drain extension regions (not specifically shown) can be formed into the exposed portions of the semiconductor substrate 12 utilizing a conventional source/drain extension ion implantation process.

In some embodiments (not shown), the source/drain regions 24 can be formed by replacement of the semiconductor material in the semiconductor substrate 12 with a new semiconductor material having a different lattice constant. In this case, the new semiconductor material is typically epitaxially aligned with a single crystalline semiconductor material of the semiconductor substrate 12, and applies a compressive stress or a tensile stress to the semiconductor material of the semiconductor substrate 12 that is located between the source/drain regions 24.

A metal semiconductor alloy 28 is then formed on an exposed upper surface of the semiconductor substrate 12. The metal semiconductor alloy 28 can be formed on the exposed upper surface of the semiconductor substrate 12, for example, by deposition of a metal layer (not shown) and an anneal. The metal layer that is employed includes any metal that when reacted with a semiconductor forms a metal semiconductor alloy. Examples of suitable metals that can be employed include, but are not limited to, Ni, Pt, W, Co, Pd, and Ti. Unreacted portions of the metal layer are typically removed selective to reacted portions of the metal layer. The reacted portions of the metal layer constitute the metal semiconductor alloy 28, which can include a metal silicide if the semiconductor material includes silicon. As is shown, edges of the metal semiconductor alloy 28 are self-aligned to the outer most edge of the spacer 22.

Figure 3:
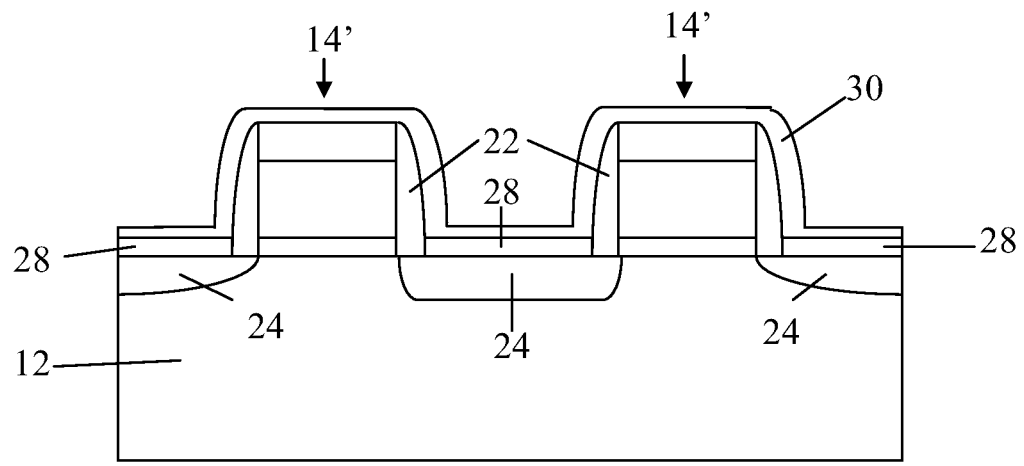
FIG. 3 is a pictorial representation (through a cross sectional view) depicting the structure of FIG. 2 after forming a self-aligned dielectric liner on exposed surfaces of the patterned sacrificial material stacks, spacers and metal semiconductor alloy.

Referring to FIG. 3, there is shown the structure of FIG. 2 after forming a self-aligned dielectric liner 30 on exposed surfaces of each patterned sacrificial material stack 14', spacer 22 and metal semiconductor alloy 28. The self-aligned dielectric liner 30 is comprised of any high k dielectric material whose dielectric constant is greater than silicon oxide. Examples of suitable high k dielectric materials that can be employed include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. In one embodiment, a Hf-containing high k material such as $HfO_2$ is employed as the self-aligned dielectric liner 30. Multilayered stacks of these high k materials can also be employed as the self-aligned dielectric liner 30. Each value of x is independently from 0.5 to 3 and each value of y is independently from 0 to 2.

The thickness of the self-aligned dielectric liner 30 may vary depending on the technique used to form the same. Typically, however, the self-aligned dielectric liner 30 has a thickness from 1 nm to 8 nm, with a thickness from 2 nm to 5 nm being even more typical. The self-aligned dielectric liner 30 can be formed by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), and other like deposition processes.

Figure 4:
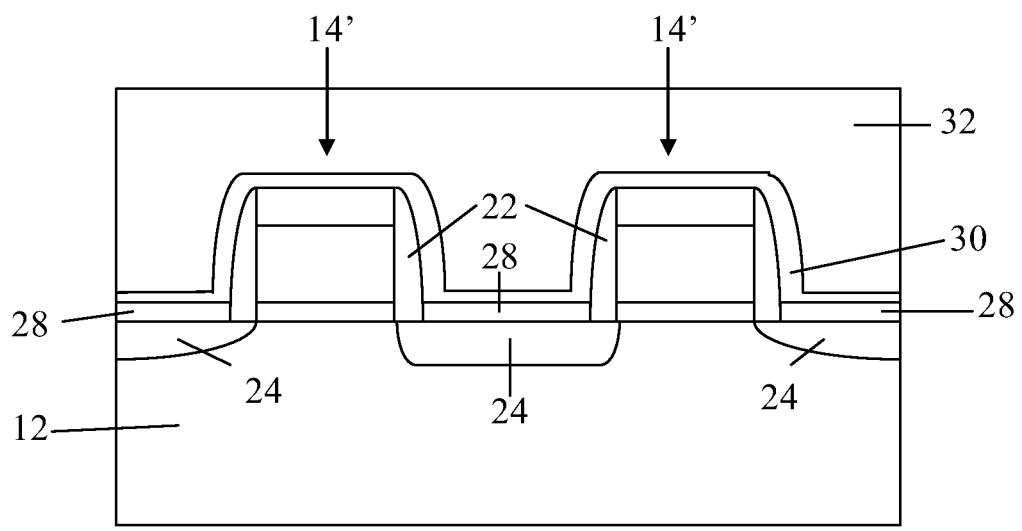
FIG. 4 is a pictorial representation (through a cross sectional view) depicting the structure of FIG. 3 after forming a planarization dielectric material layer on the structure.

Referring now to FIG. 4, there is shown the structure of FIG. 3 after forming a planarization dielectric material layer 32 on the structure. The planarization dielectric material layer 32 is composed of any dielectric material such as, for example, a doped or undoped silicon glass, silicon oxide, and silicon nitride, that can be easily planarized. The planarization dielectric material layer 32 can be formed utilizing any conventional deposition process including, for example, chemical vapor deposition (CVD), plasma enhanced chemical vapor deposition (PCVD), and physical vapor deposition (PVD). The height, e.g., vertical thickness, of the planarization dielectric material layer 32 that is formed is greater than the overall vertical thickness of each patterned sacrificial material stack 14'. Typically, and by way of an example, the vertical thickness of the planarization dielectric material layer 32 is from 50 nm to 300 nm. More typically, the vertical thickness of the planarized dielectric material layer 32 is from 100 nm to 200 nm.

Figure 5:
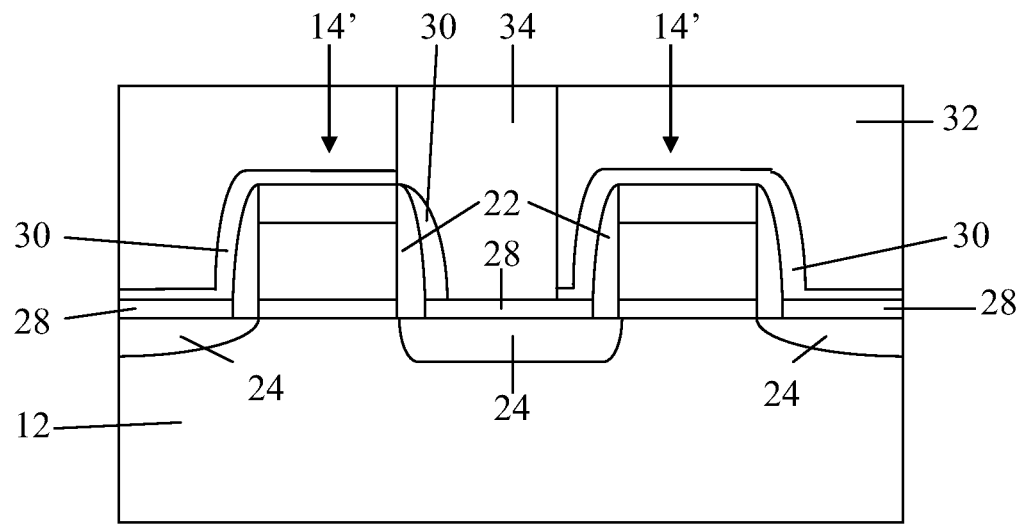
FIG. 5 is a pictorial representation (through a cross sectional view) depicting the structure of FIG. 4 after forming a contact opening through the planarization dielectric material layer, removing the self-aligned dielectric liner from all horizontal surfaces that are exposed within the contact opening, and filling the contact opening with a contact metal.

Referring now to FIG. 5, there is illustrated the structure of FIG. 4 after forming a contact opening through the planarization dielectric material layer 32, removing the self-aligned dielectric liner 30 from all horizontal surfaces that are exposed within said contact opening, and filling the contact opening with a contact metal 34.

The contact opening (not specifically labeled in FIG. 5) is formed by applying a photoresist (not shown) to an upper surface of the planarization dielectric material layer 32, exposing the photoresist to a desired pattern of radiation and developing the exposed photoresist material to provide a patterned resist (not shown) atop the planarization dielectric material layer 32. Exposed portions of the planarization dielectric material layer 32 not covered by the patterned resist are then etched to provide the contact opening. The etching step includes dry etching or wet etching and it stops on an upper surface of the self-aligned dielectric liner 30. In one embodiment, reactive ion etching is employed in forming the contact opening. After forming the contact opening, the patterned resist can be removed from atop the planarization dielectric material layer 32 utilizing a conventional resist developer. In another embodiment, the patterned resist could be removed prior to removing the dielectric liner 30 utilizing an etching process that is selective to the dielectric material 32.

After forming the contact opening, the self-aligned dielectric liner 30 is removed from all horizontal surfaces including atop a portion of each patterned sacrificial material stack 14', spacer 22 and metal semiconductor alloy 28 that are exposed within the contact opening. It is noted that during this step there could be partial or complete removal of the self-aligned dielectric liner 30 from the sidewalls, together with complete removal over the horizontal surfaces. The removal of the self-aligned dielectric liner 30 from all horizontal surfaces can be performed utilizing an etching process that selectively removes a high k dielectric material relative to the dielectric materials of hard mask material layer 20, the spacer 22, and the planarization dielectric material layer 32. In one embodiment of the present disclosure, a dry etch that is typically used to pattern a gate dielectric in a gate-first process sequence could be used to remove the self-aligned dielectric liner 30 from all horizontal surfaces of the structure. It is observed that a portion of the self-aligned dielectric liner 30 remains atop the spacer 22 in the contact opening. As shown, a bottom surface of the remaining portion of the self-aligned dielectric liner 30 that remains in the contact opening is located on an upper surface of the metal semiconductor alloy 28.

After removing the self-aligned dielectric liner 30 from all horizontal surfaces, a contact metal 34 is formed into the contact opening providing the structure shown, for example, in FIG. 5. The contact metal 34 that can be employed in the present application includes any conductive metal-containing material including, for example, W, Al, Cu, and alloy thereof. In one embodiment, the contact metal 34 can be comprised of W. The contact metal 34 can be formed utilizing any conventional deposition process including, chemical vapor deposition (CVD), physical vapor deposition (PVD), sputtering, and plating.

Figure 6:
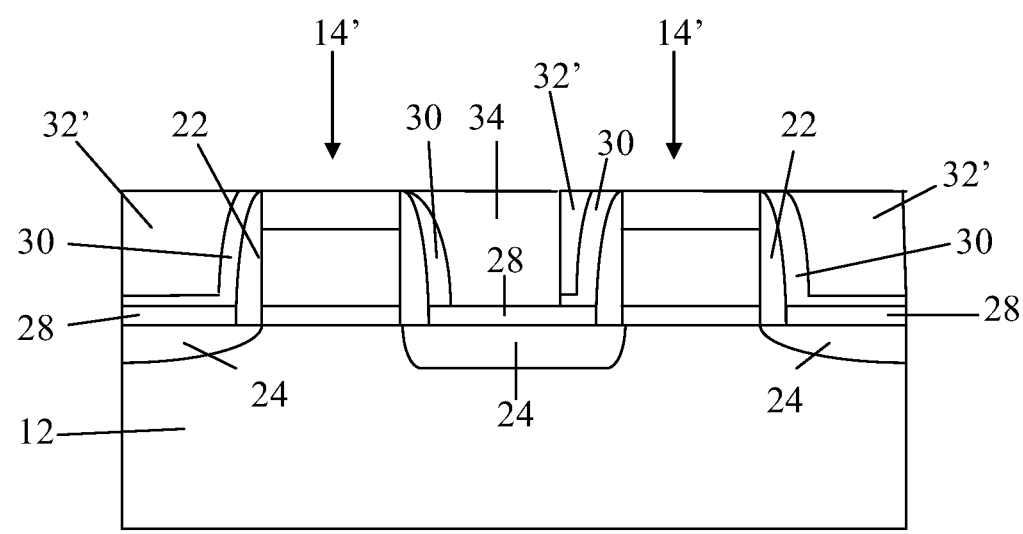
FIG. 6 is a pictorial representation (through a cross sectional view) depicting the structure of FIG. 5 after performing a planarization process that stops on an upper surface of each patterned sacrificial material stack.

Referring to FIG. 6, there is illustrated the structure of FIG. 5 after performing a planarization process that stops on an upper surface of each patterned sacrificial material stack 14'. In the particular embodiment illustrated in the drawings, the planarization process stops on an upper surface of the patterned hard mask material 20'. The planarization process that can be used in forming the structure shown in FIG. 6 includes chemical mechanical planarization and/or grinding. It is observed that in FIG. 6, reference numeral 32' is used to denote the planarized dielectric material layer that is formed. It is also observed that during the planarization process remaining portions of the self-aligned dielectric liner 30 that are outside the contact opening are removed from the structure. As shown, portions of the self-aligned dielectric liner 30 remain within the contact opening.

Figure 7:
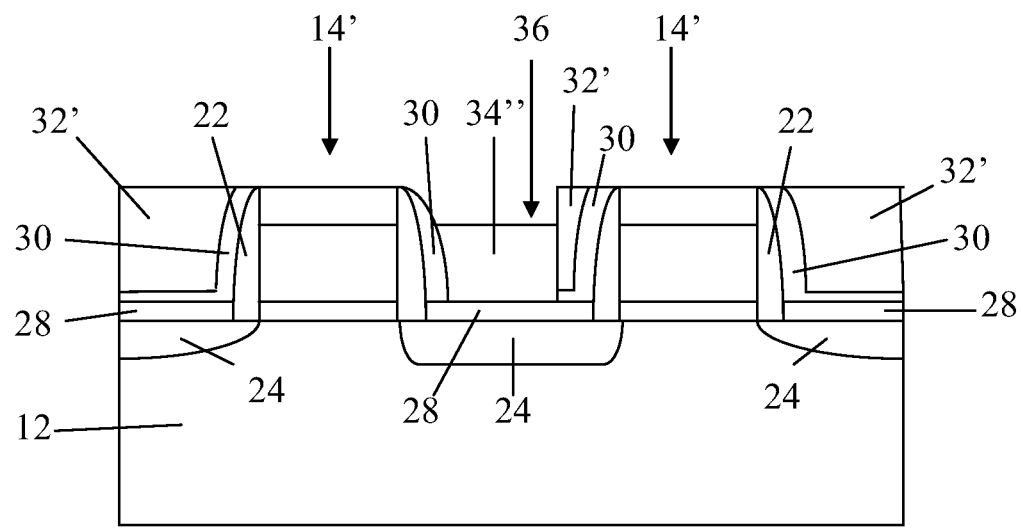
FIG. 7 is a pictorial representation (through a cross sectional view) depicting the structure of FIG. 6 after recessing an upper portion of the contact metal below an upper surface of the planarized dielectric material layer.

Referring to FIG. 7, there is shown the structure of FIG. 6 after recessing an upper portion of the contact metal 34 below an upper surface of the planarized dielectric material layer 32' providing a recessed region 36 above a remaining portion of the contact metal; the remaining portion of the contact metal (or recessed contact metal) is labeled as 34' in the drawing. The recessing is performed in the present disclosure utilizing an etching process, typically a timed etching process that selectively removes an upper portion of the contact metal. In one embodiment of the present disclosure, a combination of dry etch technique and a wet etchant can be used to recess the contact metal 34. As shown, the self-aligned dielectric liner 30 remaining in the contact opening has an upper surface that extends above and is offset from an upper surface of the recessed contact metal 34'.

Figure 8:
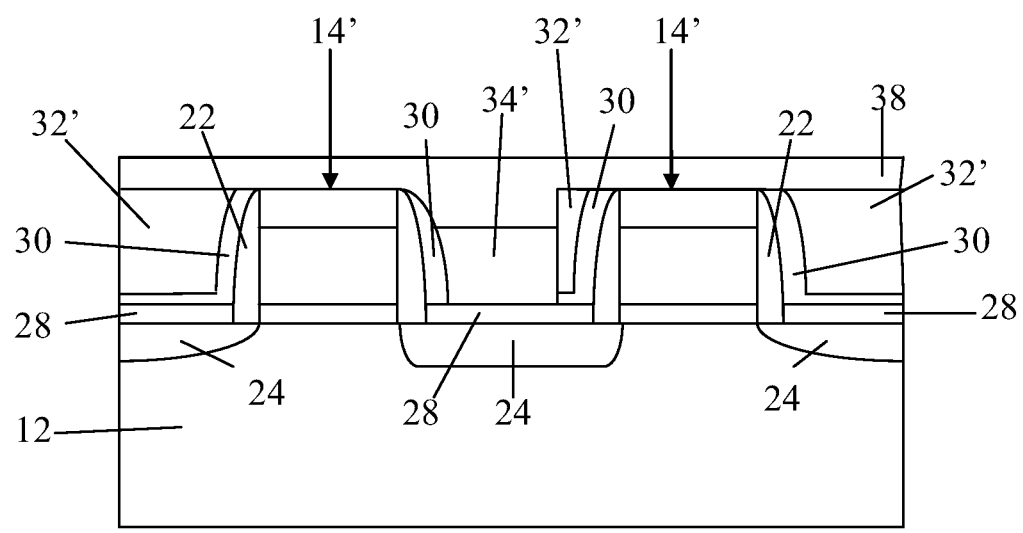
FIG. 8 is a pictorial representation (through a cross sectional view) depicting the structure of FIG. 7 after forming an oxide atop at least the recessed contact metal.

Referring to FIG. 8, there is illustrated the structure of FIG. 7 after forming an oxide layer 38 atop the recessed contact metal 34'. As shown, the oxide layer 38 completely fills the recessed region 36 and extends atop the spacer 22 and each of the patterned sacrificial material stacks 14'. The oxide layer 38 can be formed by a conventional deposition process including, for example, chemical vapor deposition (CVD) and plasma enhanced chemical vapor deposition. In one embodiment, the oxide layer 38 is formed using tetraethylorthosilicate (TEOS) as a precursor.

Figure 9:
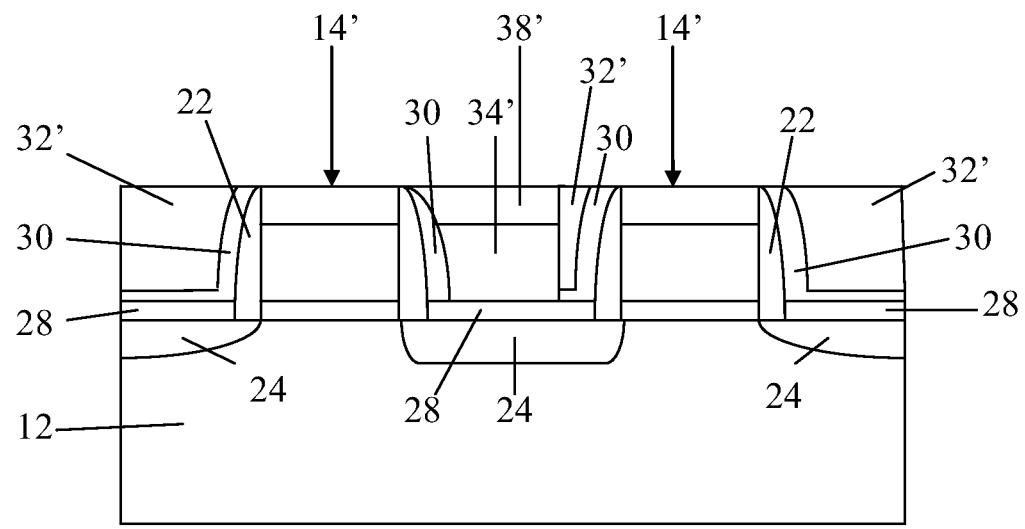
FIG. 9 is a pictorial representation (through a cross sectional view) depicting the structure of FIG. 8 after performing another planarization step.

Referring to FIG. 9, there is illustrated the structure of FIG. 8 after performing another planarization step which removes the oxide layer 38 from the upper surface of the planarized dielectric material 32' and from atop each patterned sacrificial material stack 14'. The another planarization step includes chemical mechanical planarization and/or grinding and provides a structure in which a portion of oxide layer 38 remains atop the recessed contact metal 34'. In FIG. 9, reference numeral 38' denotes the portion of the oxide layer that remains atop the recessed contact metal 34'. The portion of the oxide layer 38' that remains atop the recessed contact metal 34' can also be referred to herein as an oxide cap 38'.

Figure 10:
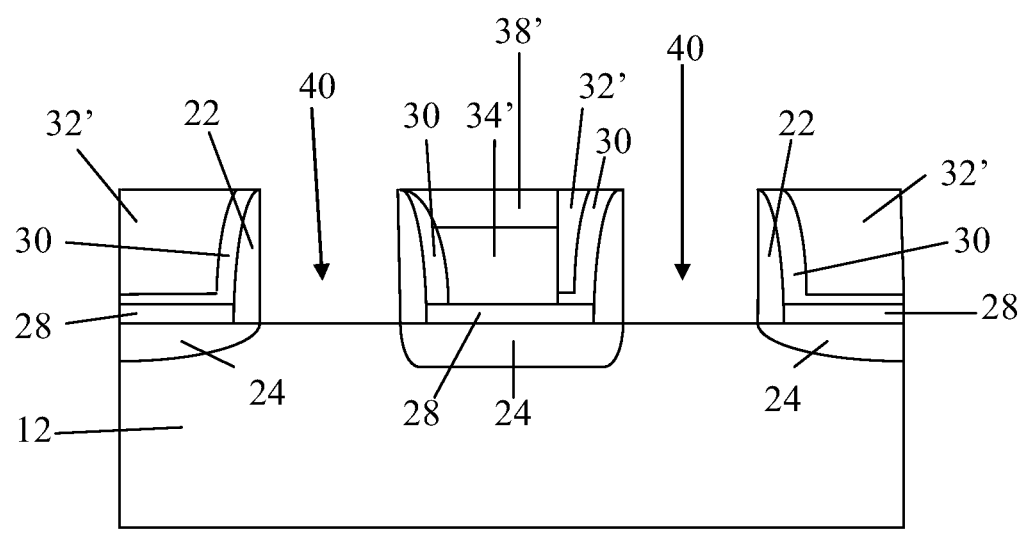
FIG. 10 is a pictorial representation (through a cross sectional view) depicting the structure of FIG. 9 after removing each patterned sacrificial material stack from atop the semiconductor substrate.

Reference is now made to FIG. 10, which illustrates the structure of FIG. 9 after removing a portion of each patterned sacrificial material stack 14' from atop the semiconductor substrate 12. In some embodiments, the entirety of patterned sacrificial material stack 14' including the patterned hard mask 20', the patterned sacrificial gate material layer 18' and the patterned sacrificial dielectric layer 16' is removed. In another embodiment, the patterned sacrificial dielectric layer 16' may remain atop the substrate 12 and serve as an interfacial dielectric material. FIG. 10 illustrates an embodiment in which the patterned sacrificial dielectric layer 16' is removed.

The removal of the patterned sacrificial material stack 14' from the structure can be achieved utilizing one or more etching steps. In some embodiments, a first etch step is used for removing the patterned hard mask material layer 20', a second etch step is used in removing the patterned sacrificial gate material layer 16' and an optional third etch is used in optionally removing the patterned sacrificial dielectric layer 14'. In such an embodiment, the first etch may include a dry etch RIE process, the second etch may include a wet etching process using, for example, $NH_4OH$ or TMAH, and the optional third etch may include dilute HF. As shown in FIG. 10, a gate cavity 40 is formed.

Figure 11:
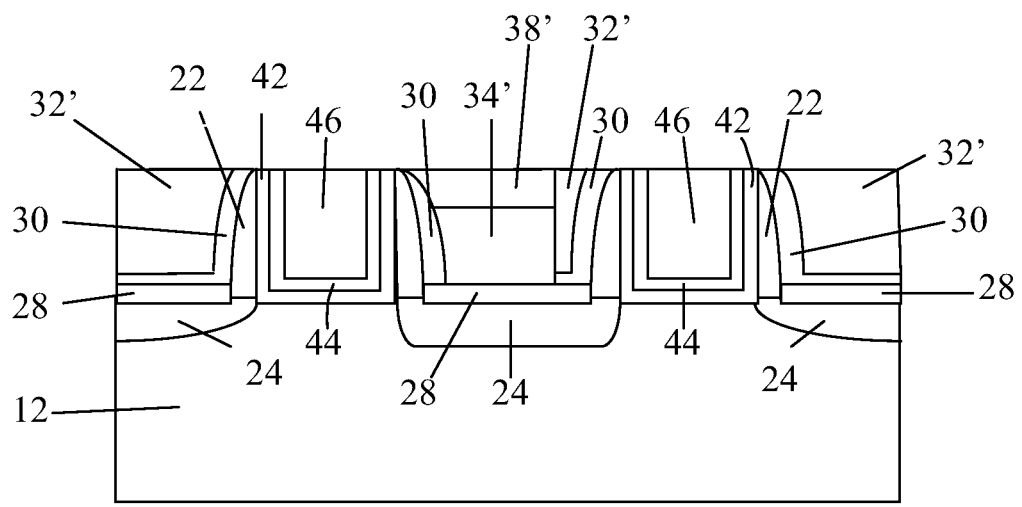
FIG. 11 is a pictorial representation (through a cross sectional view) depicting the structure of FIG. 10 after forming a metal gate stack including a high k gate dielectric layer, a work function metal layer and a conductive metal layer within the area occupied previously by each patterned sacrificial material stack, and planarization.

Referring now to FIG. 11, there is shown the structure of FIG. 10 after forming a metal gate stack including a high k gate dielectric layer 42, a work function metal layer 44 and a conductive metal layer 46 within gate cavity 40 and planarization. As shown, the high k gate dielectric layer 42 and the work function metal layer 44 are both U-shaped.

The high k gate dielectric layer 42 is comprised of a dielectric material that has a dielectric constant, as measured in a vacuum, of greater than 8.0. The high k gate dielectric layer 42 can include a dielectric metal oxide, which is a high k material containing a metal and oxygen. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high k gate dielectric layer 42, as measured at horizontal portions, can be from 0.9 nm to 6 nm, and preferably from 1.0 nm to 3 nm. The high k gate dielectric layer 42 may have an effective oxide thickness on the order of or less than 1 nm.

The work function metal layer 44 includes a metal, which has a work function. The metal of the work function metal layer 44 is selected to optimize the performance of a transistor to be subsequently formed.

In one embodiment, the work function metal layer 44 includes a silicon valence band edge metal such as Pt, Rh, Ir, Ru, Cu, Os, Be, Co, Pd, Te, Cr, Ni, TiN, and alloys thereof. A silicon valence band edge metal is a metal having a work function that is closer to the work function corresponding to the valence band edge of silicon, i.e., 5.10 eV, than to the work function corresponding to the conduction band edge of silicon, i.e., 4.00 eV. Thus, a silicon valence band edge metal has a work function that is greater than 4.55 eV. For example, the work function metal layer 44 can be a layer of TiN.

In another embodiment, the work function metal layer 44 includes a silicon conduction band edge metal such as Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, and alloys thereof. A silicon conduction band edge metal is a metal having a work function that is closer to the work function corresponding to the conduction band edge of silicon than to the work function corresponding to the valence band edge of silicon. Thus, a silicon conduction band edge metal has a work function that is less than 4.55 eV. For example, the work function metal layer 44 can be a layer of TiAl.

The work function metal layer 44 can be formed, for example, by physical vapor deposition, chemical vapor deposition, or atomic layer deposition (ALD). Typically, the thickness of the work function metal layer 44 is from 1 nm to 30 nm, with a thickness from 2 nm to 10 nm being more typical.

The conductive metal layer 46 is then formed on the work function metal layer 44. The conductive metal layer 46 can include a conductive material deposited by physical vapor deposition, chemical vapor deposition or other suitable deposition techniques. The conductive metal layer 46 can be composed of an elemental metal such as Al, Au, Ag, Cu, or W or an alloy thereof. In one embodiment, the conductive metal layer 46 can consist essentially of Al.

The thickness of the conductive metal layer 46 can vary depending on the conductive material employed as well as the technique that was employed in forming the same. Typically, and by way of an example, the conductive metal layer 46 has a thickness from 100 nm to 500 nm.

Following the formation of the high k gate dielectric layer 42, the work function metal layer 44 and the conductive metal layer 46, the structure is subjected to planarization such as, for example, chemical mechanical planarization and/or grinding to provide the structure shown, for example in FIG. 11.

Figure 12:
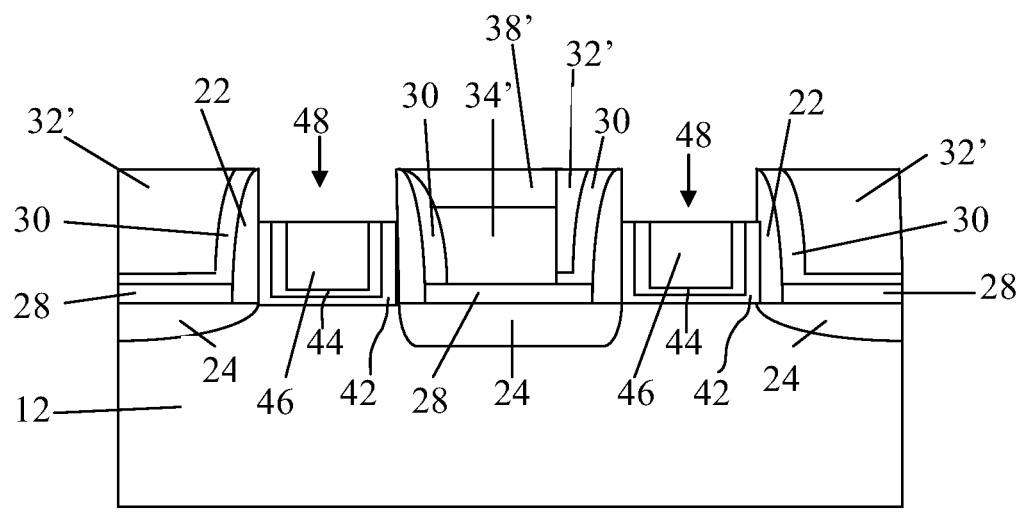
FIG. 12 is a pictorial representation (through a cross sectional view) depicting the structure of FIG. 11 after recessing the metal gate stack.

Referring now to FIG. 12, there is illustrated the structure of FIG. 11 after recessing the metal gate stack forming recessed area 48 in the structure. The recessing of the metal gate stack includes the use of one or more etching steps that selectively remove an upper portion of the metal gate stack. In one embodiment of the present disclosure, a combination of wet etchants using, for example, dilute sulfuric acid and hydrogen peroxide mixtures with dilute HF and RIE chemistries containing $CHF_3$, $CF_4$ or $Cl_2$ can be used to form the recessed area 48 in the structure.

Figure 13:
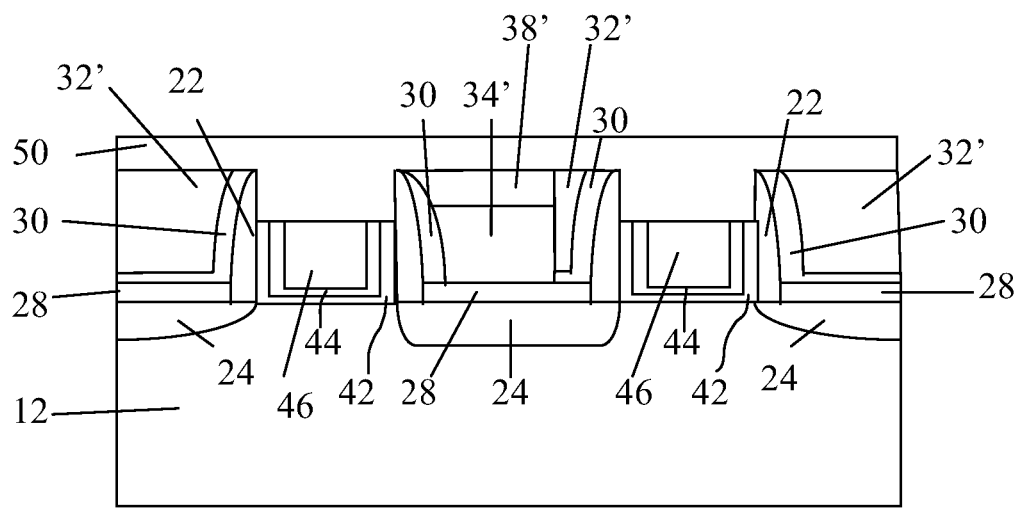
FIG. 13 is a pictorial representation (through a cross sectional view) depicting the structure of FIG. 12 after hard mask deposition and planarization.

Referring now to FIG. 13, there is illustrated the structure of FIG. 12 after forming another hard mask 50 and planarization. The another hard mask 50 can be formed utilizing one of the deposition processed mentioned above for forming hard mask material layer 20. The another hard mask 50 can comprise one of the materials mentioned above for hard mask material layer 20. In one embodiment, the another hard mask 50 is comprised of silicon nitride. The planarization of the another hard mask 50 can be performed by chemical mechanical planarization and/or grinding.

Figure 14:
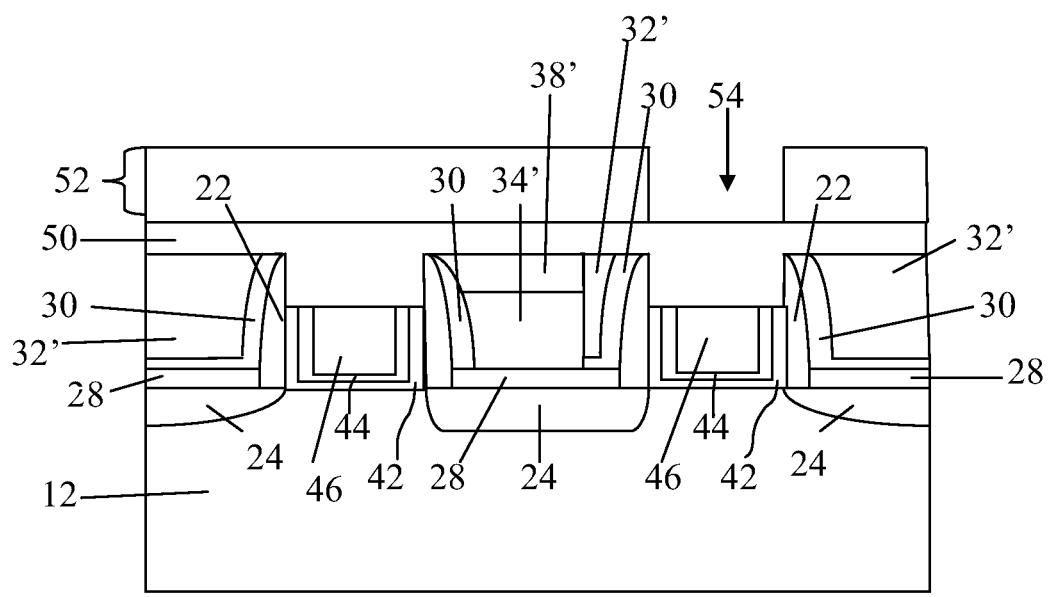
FIG. 14 is a pictorial representation (through a cross sectional view) depicting the structure of FIG. 13 after forming a patterned resist having a gate opening atop the hard mask.

Referring to FIG. 14, there is illustrated the structure of FIG. 13 after forming a patterned resist 52 having a gate opening 54 atop the another hard mask 50. The patterned photoresist 52 having the gate opening 54 is formed by conventional lithography including applying a photoresist material atop the another hard mask 50, exposing the photoresist material to a desired pattern of radiation and developing the exposed photoresist utilizing a conventional resist developer.

Figure 15:
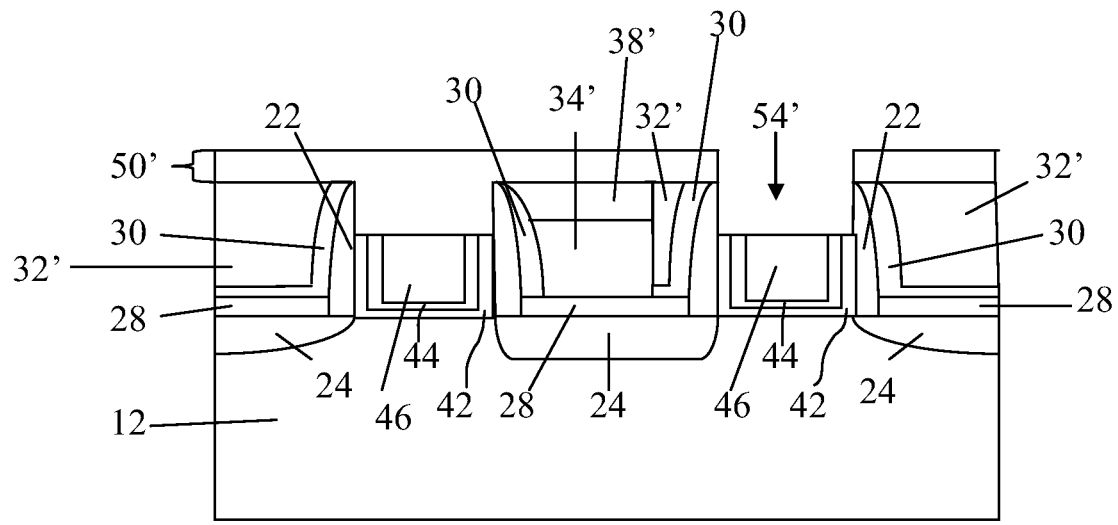
FIG. 15 is a pictorial representation (through a cross sectional view) depicting the structure of FIG. 14 after transferring the gate opening into the hard mask and removing the patterned resist.

Referring to FIG. 15, there is illustrated the structure of FIG. 14 after transferring the gate opening 52 into the another hard mask 50 forming patterned hard mask 50' and removing the patterned resist 52. The transferring step includes dry etching or wet etching, while the removal of the patterned resist 52 includes the use of a conventional resist stripping process such as, for example, ashing. The patterned hard mask 50' now includes gate opening 54' therein as is shown in FIG. 15.

Figure 16:
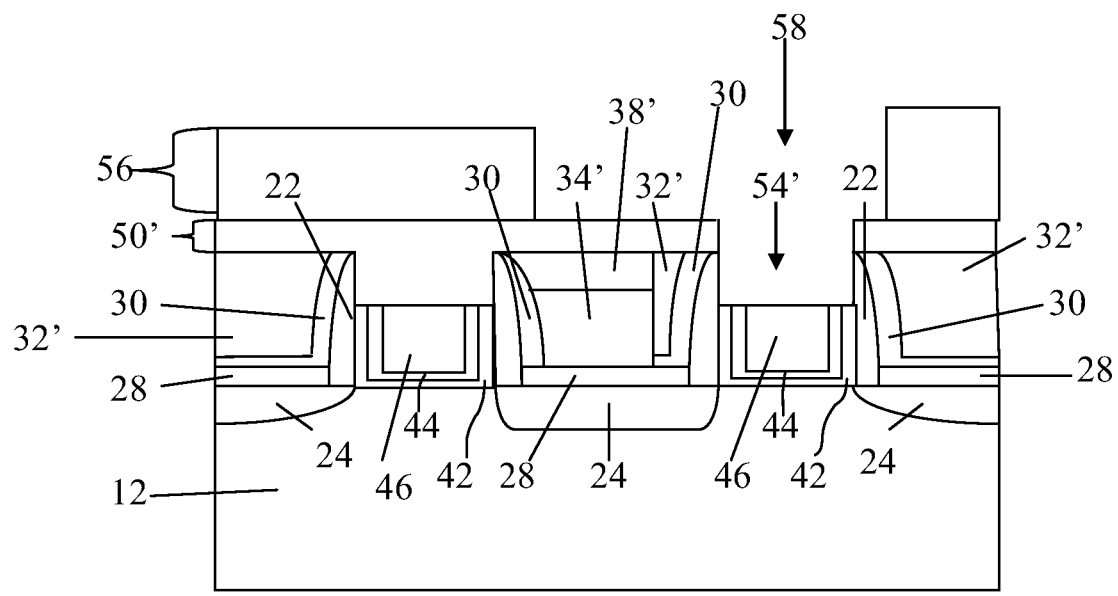
FIG. 16 is a pictorial representation (through a cross sectional view) depicting the structure of FIG. 15 after forming another patterned resist having a line opening atop the patterned hard mask.

Referring to FIG. 16, there is illustrated the structure of FIG. 15 after forming another patterned resist 56 having a line opening 58 atop the patterned hard mask 50'. The another patterned resist 56 having the line opening 58 is formed utilizing the same technique as mentioned above for forming the patterned resist 52.

Figure 17:
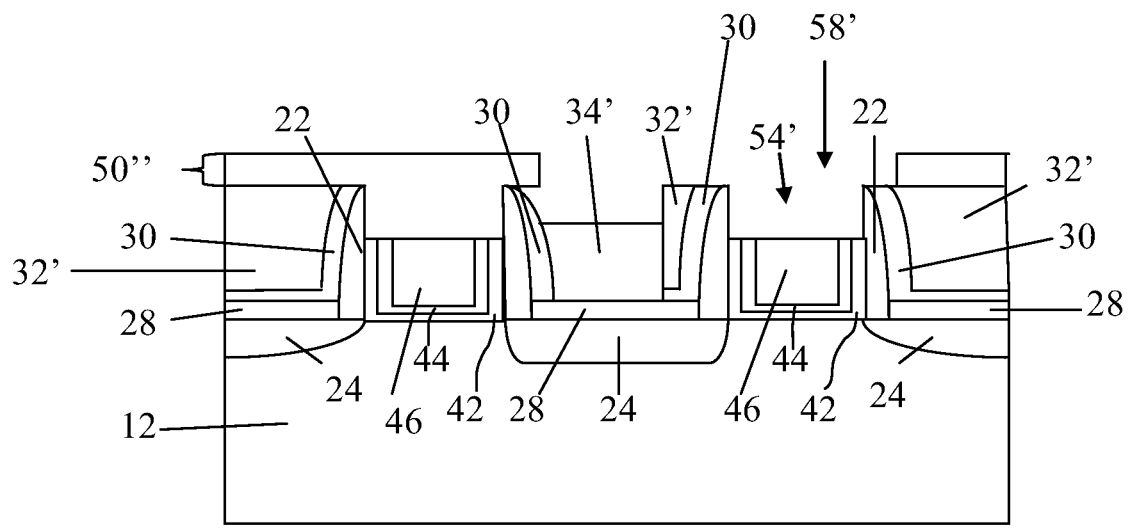
FIG. 17 is a pictorial representation (through a cross sectional view) depicting the structure of FIG. 16 after etching and removal of the another patterned resist having the line opening.

Referring now to FIG. 17, there is illustrated the structure of FIG. 16 after performing an etch and removal of the another patterned resist 56 having the line opening 58. The etch includes dry etching or wet etching and the removal of the another patterned resist 56 includes a conventional resist stripping process such as, for example, ashing. As is shown in FIG. 17, this step provides a patterned hard mask 50" that includes a line opening 58' therein. During the etch, or in a subsequent etch, the oxide cap 38' is removed from atop the recessed contact metal 34'. It is observed that the etching step or steps used in this part of the present disclosure exposes an upper surface of the recessed contact metal 34'.

Figure 18:
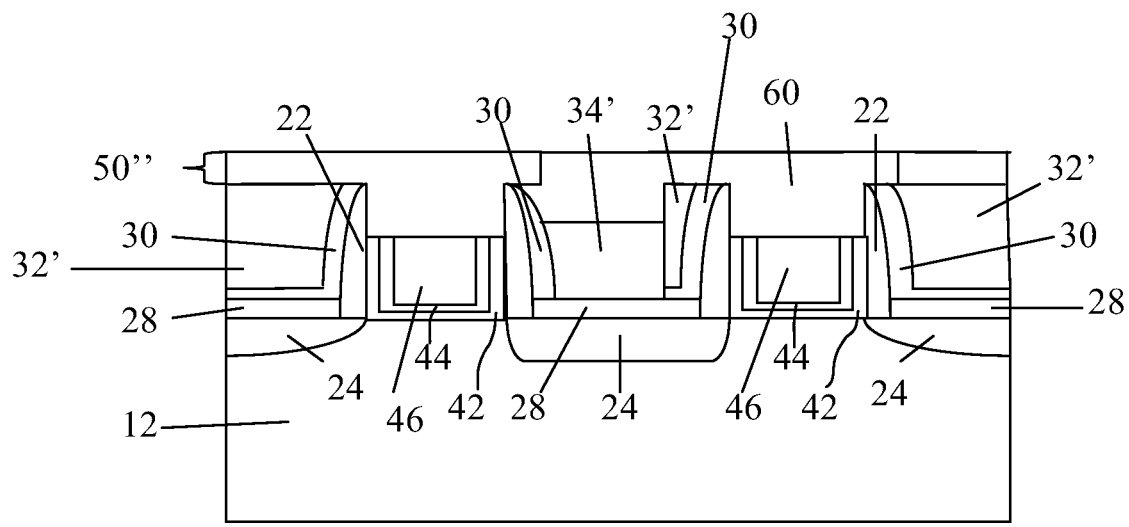
FIG. 18 is a pictorial representation (through a cross sectional view) depicting the structure of FIG. 17 after filling the etched area with another conductive metal layer, and planarization.

Referring to FIG. 18, there is illustrated the structure of FIG. 17 after filling the line opening 58' and the gate opening 54' within the patterned hard mask 50" and the recessed area with another contact metal 60, and planarization. The another contact material 60 may be formed utilizing one of the techniques mentioned above in forming the contact metal 34. The another contact metal 60 may comprise the same or different, typically, the same conductive metal as that of the contact metal 34.

The structure shown in FIG. 18 includes semiconductor substrate 12 having a plurality of gate stacks located on a surface of the semiconductor substrate 12. Each gate stack includes, from bottom to top, a high k gate dielectric layer 42, a work function metal layer 44 and a conductive metal 46. A spacer 22 is located on sidewalls of each gate stack and a self-aligned dielectric liner 30 is present on an upper surface of each spacer 22. A bottom surface of each self-aligned dielectric liner 30 is present on an upper surface of a semiconductor metal alloy 28. A contact metal 34' is located between neighboring patterned gate stacks and is separated from each gate stack by the self-aligned dielectric liner 30. The structure also includes another contact metal 60 having a portion that is located on and in direct contact with an upper surface of the contact metal 34' and another portion that is located on and in direct contact with the conductive metal 46 of one of the gate stacks.

Reference is now made to FIGS. 19-33 which illustrate another embodiment of the present disclosure. In this embodiment of the present disclosure, patterned permanent gate stacks are provided instead of the patterned sacrificial gate stacks described in the above embodiment.

Figure 19:
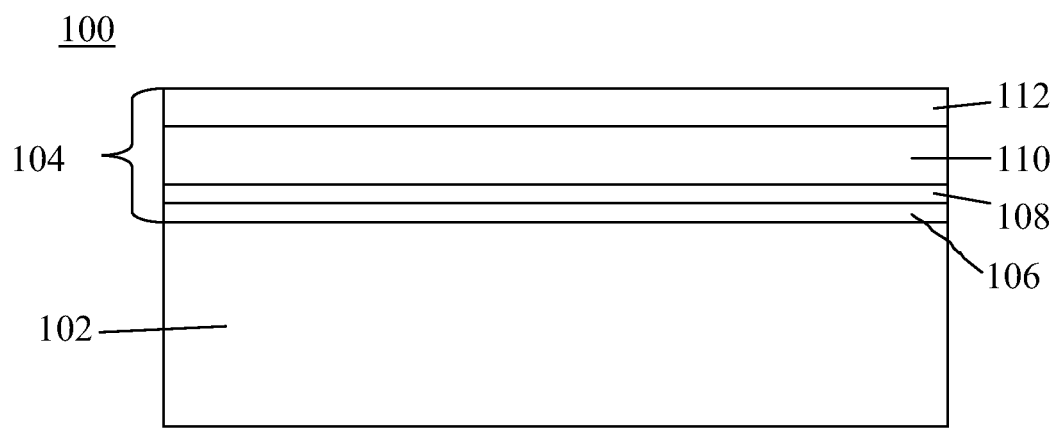
FIG. 19 is a pictorial representation (through a cross sectional view) depicting an initial structure including a permanent gate material stack on a surface of a semiconductor substrate that can be employed in another embodiment of the present application.

Reference is first made to FIG. 19, which is an illustration of an initial structure 100 that includes a permanent gate material stack 104 located on a surface of a semiconductor substrate 102 that can be employed in this embodiment of the present application. Semiconductor substrate 102 includes one of the semiconductor materials mentioned above for semiconductor substrate 12. Also, semiconductor substrate 102 can be processed as described above for semiconductor substrate 12.

The permanent (i.e., non-sacrificial) gate material stack 104 that is formed atop the semiconductor substrate 102 includes, from bottom to top, a high k gate dielectric layer 106, a work function metal layer 108, a polysilicon layer 110 and a hard mask material layer 112.

The high k gate dielectric layer 106 includes one of the high k gate dielectric materials mentioned above for high k gate dielectric layer 42. The high k gate dielectric layer 106 can be formed utilizing one of the techniques mentioned above for high k gate dielectric layer 42. Also, the high k gate dielectric layer 106 of this embodiment of the present disclosure has a thickness within the range mentioned above for the high k gate dielectric layer 42.

The work function metal layer 108 includes one of the metals mentioned above for work function metal layer 44, and its thickness is within the thickness range mentioned above for work function metal layer 44. The work function metal layer 108 can be formed utilizing one of the techniques mentioned above for forming work function metal layer 44.

The polysilicon layer 110 of the permanent gate material stack 104 can be formed utilizing any conventional deposition process including, for example, chemical vapor deposition. The polysilicon layer 110 can be doped with an n-type or p-type dopant in-situ during the deposition process or it can be doped after deposition using, for example, ion implantation or gas phase doping. The polysilicon layer 110 has a thickness that is typically from 20 nm to 100 nm, with a thickness from 30 nm to 60 nm being even more typical.

The hard mask material layer 112 may include one of the hard mask materials mentioned above for hard mask material layer 20. The hard mask material layer 112 can be formed utilizing one of the techniques mentioned above for the hard mask material layer 20. The thickness of hard mask material layer 112 can also be within the thickness range mentioned above for hard mask material layer 20.

Figure 20:
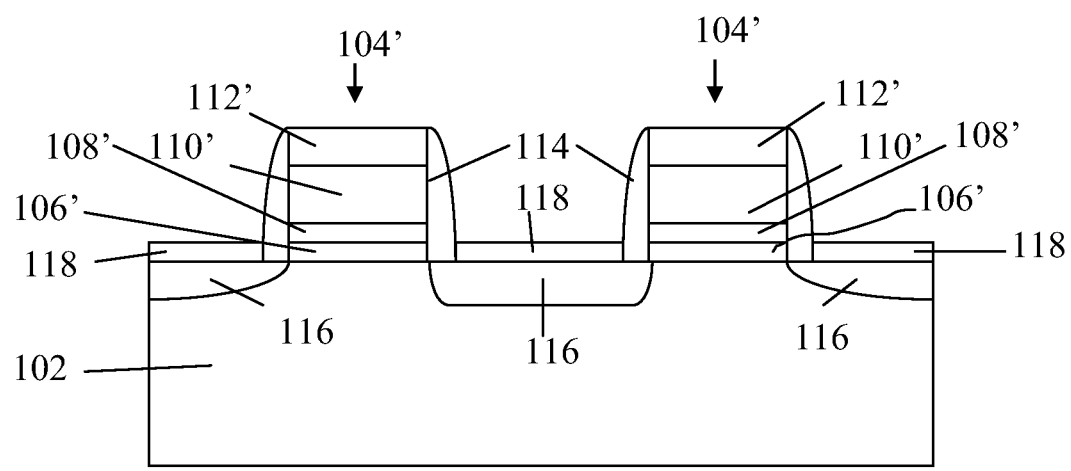
FIG. 20 is a pictorial representation (through a cross sectional view) depicting the initial structure of FIG. 19 after patterning the permanent gate material stack, forming a spacer on the sidewalls of each patterned permanent gate stack formed, and after forming a metal semiconductor alloy on an exposed upper surface of the semiconductor substrate.

Referring now to FIG. 20, there is shown the initial structure 100 of FIG. 19 after patterning the permanent gate material stack 104 forming patterned permanent gate stacks 104' including patterned high k gate dielectric layer 106', patterned work function material layer 108', patterned polysilicon layer 110' and patterned hard mask material layer 112' on the surface of semiconductor substrate 102. FIG. 20 also shows the formation of spacer 114 on the sidewalls of each patterned permanent gate stack 104', formation of source/drain regions 116 and formation of a metal semiconductor alloy 118.

The patterned permanent gate stacks 104' can be formed utilizing the technique mentioned above for forming the patterned sacrificial gate stacks 14'. The spacer 114 employed in this embodiment may include one of the dielectric materials mentioned above for spacer 22, and spacer 114 can be formed utilizing one of the above mentioned techniques mentioned above for forming spacer 22. Source/drain regions 116 can be formed as described above for source/drain regions 24. The metal semiconductor alloy 118 that is formed in this embodiment can be formed and include materials as mentioned above for metal semiconductor alloy 28.

Figure 21:
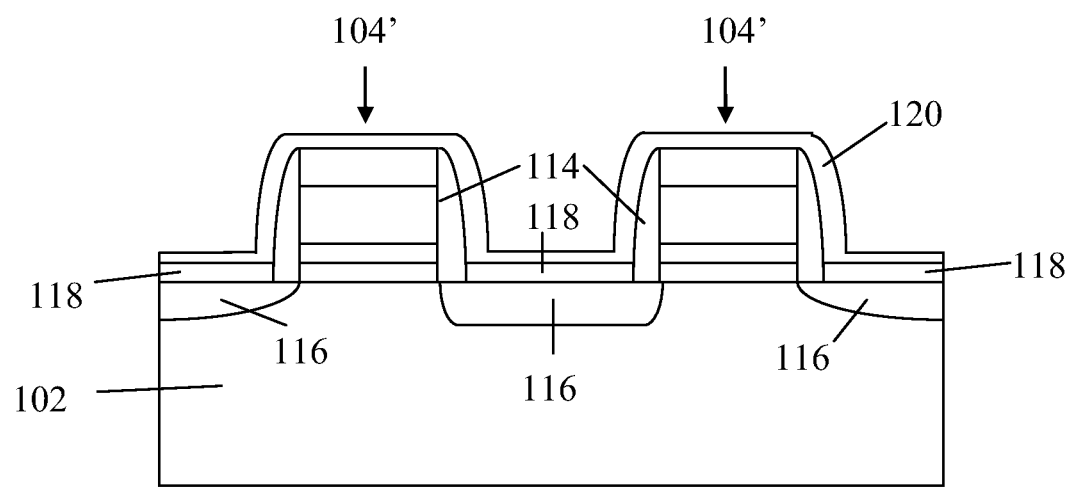
FIG. 21 is a pictorial representation (through a cross sectional view) depicting the structure of FIG. 20 after forming a self-aligned dielectric liner on exposed surfaces of each patterned permanent gate stack, spacers and metal semiconductor alloy.

Referring now to FIG. 21, there is depicted the structure of FIG. 20 after forming a self-aligned dielectric liner 120 on exposed surfaces of the patterned permanent gate stack 104', spacers 114 and metal semiconductor alloy 118. The materials, thickness and techniques mentioned above in describing self-aligned dielectric liner 30 are applicable here for the self-aligned dielectric liner 120.

Figure 22:
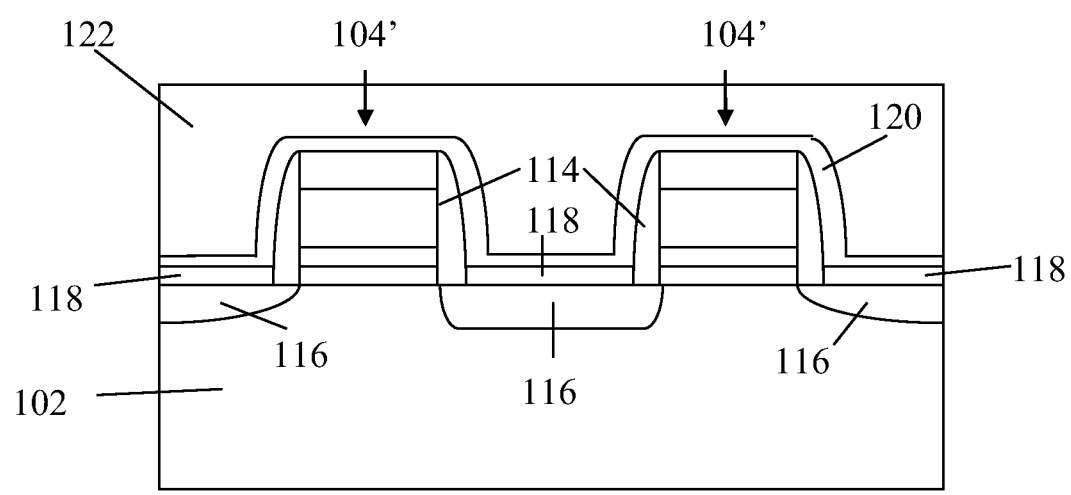
FIG. 22 is a pictorial representation (through a cross sectional view) depicting the structure of FIG. 21 after forming a planarization dielectric material layer on the structure.

Referring now to FIG. 22, there is depicted the structure of FIG. 21 after forming a planarization dielectric material layer 122 on the structure. The planarization dielectric material layer 122 employed in this embodiment includes one of the dielectric materials mentioned above for planarization dielectric material layer 32. Also, planarization dielectric material layer 122 can be formed utilizing one of the techniques mentioned above for forming planarization dielectric material layer 32. The vertical thickness of planarization dielectric material layer 122 can be within the range as mentioned above for planarization dielectric material layer 32.

Figure 23:
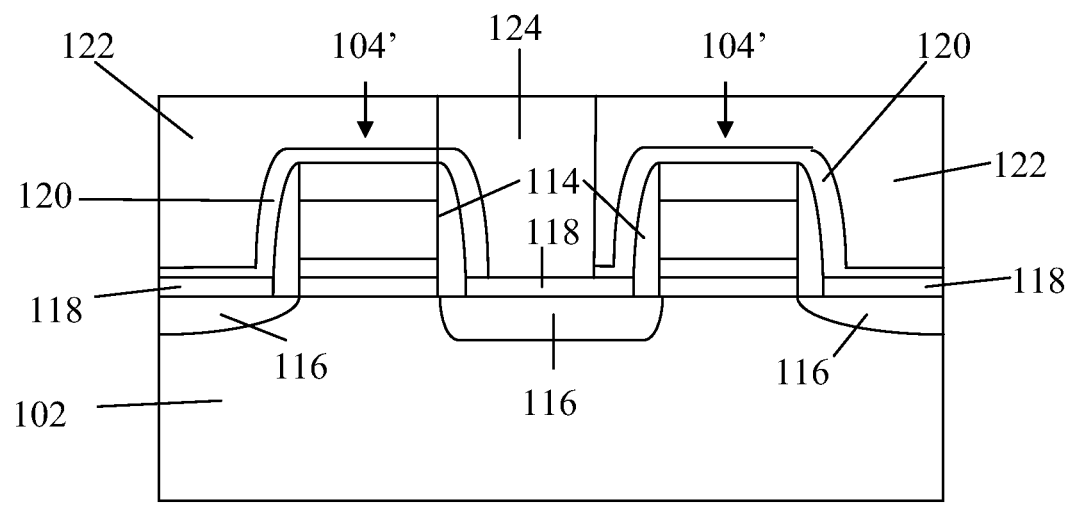
FIG. 23 is a pictorial representation (through a cross sectional view) depicting the structure of FIG. 22 after forming a contact opening through the planarization dielectric material layer, removing the self-aligned dielectric liner from all horizontal surfaces that are exposed within said contact opening, and filling the contact opening with a contact metal.

Referring to FIG. 23, there is shown the structure of FIG. 22 after forming a contact opening through the planarization dielectric material layer 122, removing the self-aligned dielectric liner 120 from all horizontal surfaces that are exposed within said contact opening, and filling the contact opening with a contact metal 124. The formation of the contact opening, removal of the self-aligned dielectric liner 120 and filling of the contact opening with contact metal 124 include processing steps and materials as mentioned above for forming the structure shown in FIG. 5.

Figure 24:
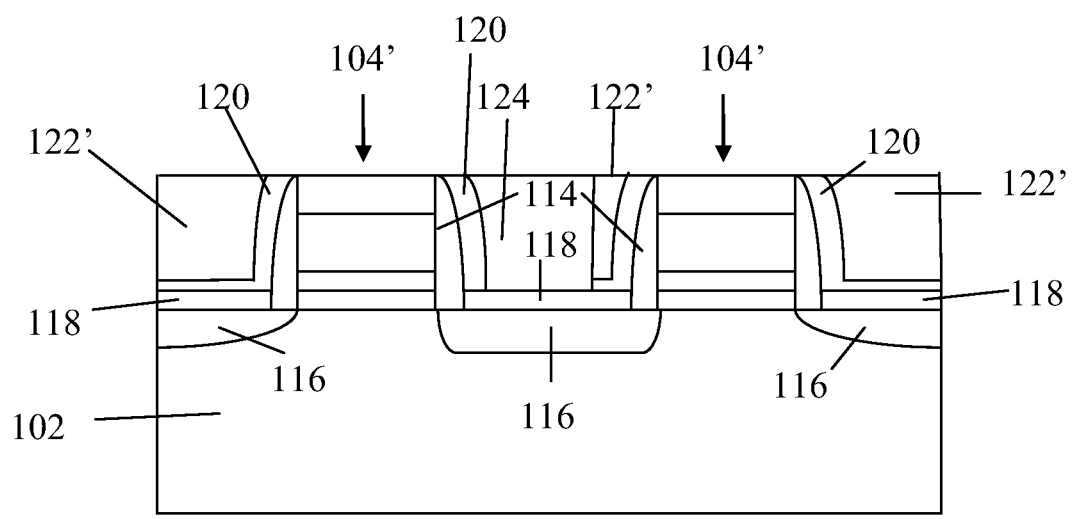
FIG. 24 is a pictorial representation (through a cross sectional view) depicting the structure of FIG. 23 after performing a planarization process that stops on an upper surface of each patterned permanent gate stack.

Referring to FIG. 24, there is shown the structure of FIG. 23 after performing a planarization process that stops on an upper surface of each patterned permanent gate stack 104'. The planarization used in this embodiment of the present disclosure is the same as mentioned above for forming the structure shown in FIG. 6. In FIG. 24, reference numeral 122' denotes the planarized dielectric material layer.

Figure 25:
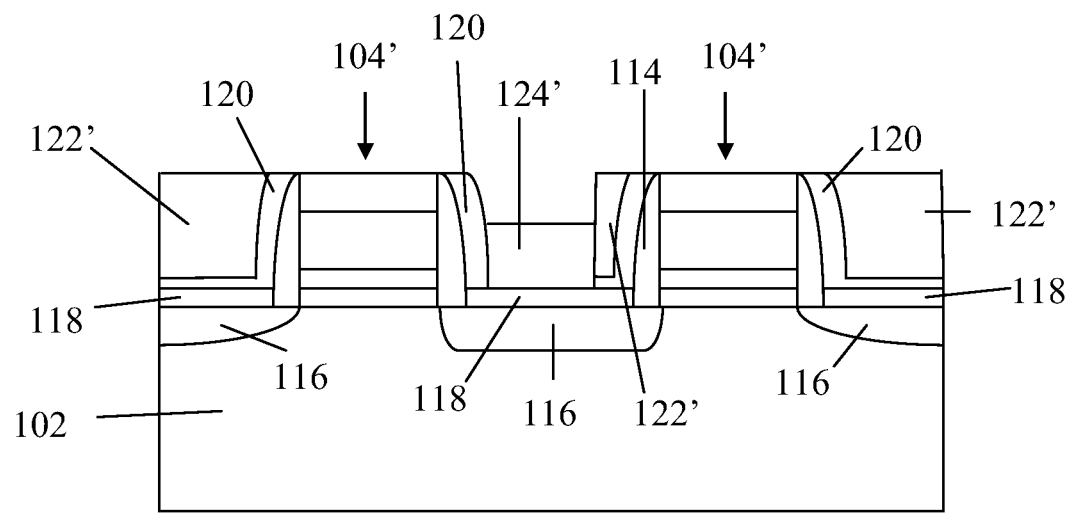
FIG. 25 is a pictorial representation (through a cross sectional view) depicting the structure of FIG. 24 after recessing an upper portion of the contact metal below an upper surface of the planarized dielectric material layer.

Referring to FIG. 25, there is shown the structure of FIG. 24 after recessing an upper portion of the contact metal 124 below an upper surface of the planarized dielectric material layer 122'. The recess step used in this embodiment of the present disclosure is the same as mentioned above for forming the structure shown in FIG. 7. In FIG. 25, reference numeral 124' denotes the recessed contact metal.

Figure 26:
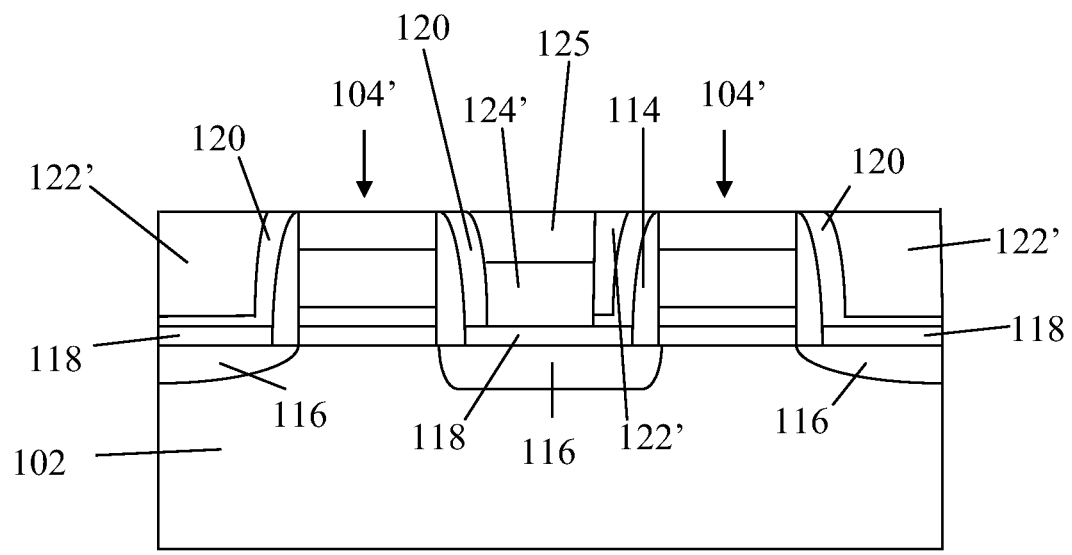
FIG. 26 is a pictorial representation (through a cross sectional view) depicting the structure of FIG. 25 after forming a planarized oxide cap atop the recessed contact metal.

Referring now to FIG. 26, there is illustrated the structure of FIG. 25 after forming a planarized oxide cap 125 on the recessed contact metal 124'. The planarized oxide cap 125 is formed using the same techniques used in forming the oxide layer 38 and planarized oxide cap 38' described above in connection with FIGS. 8 and 9 of the replacement gate process flow described above.

Figure 27:
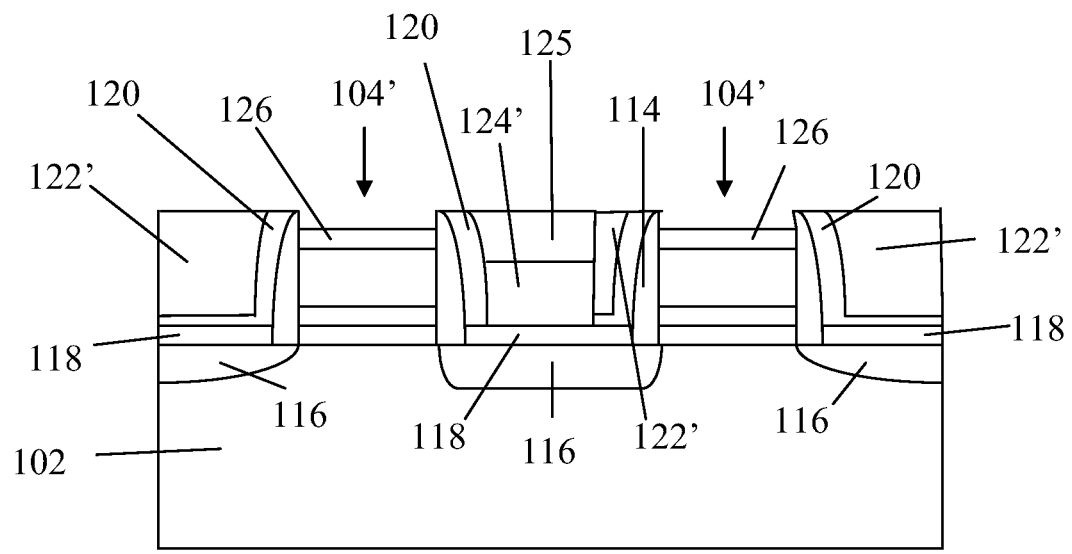
FIG. 27 is a pictorial representation (through a cross sectional view) depicting the structure of FIG. 26 after removing the patterned hard mask for atop each of the patterned permanent gate stacks and forming a metal silicide atop the patterned polysilicon layer of each patterned permanent gate stack.

Referring now to FIG. 27, there is shown the structure of FIG. 26 after removing the patterned hard mask material layer 112' for atop each of the patterned permanent gate stacks 104' and forming a metal silicide 126 atop the patterned polysilicon layer 120' of each patterned permanent gate stack 104'. The removal of hard mask material layer 112' includes the use of any etching process that selectively removes the hard mask material relative to planarized dielectric material 122'. An example of such a selective etch includes fluorine containing RIE chemistry. The formation of the metal silicide 126 atop the now exposed patterned polysilicon layer 120' can be performed utilizing the same technique mentioned above for forming metal semiconductor alloy 28.

Figure 28:
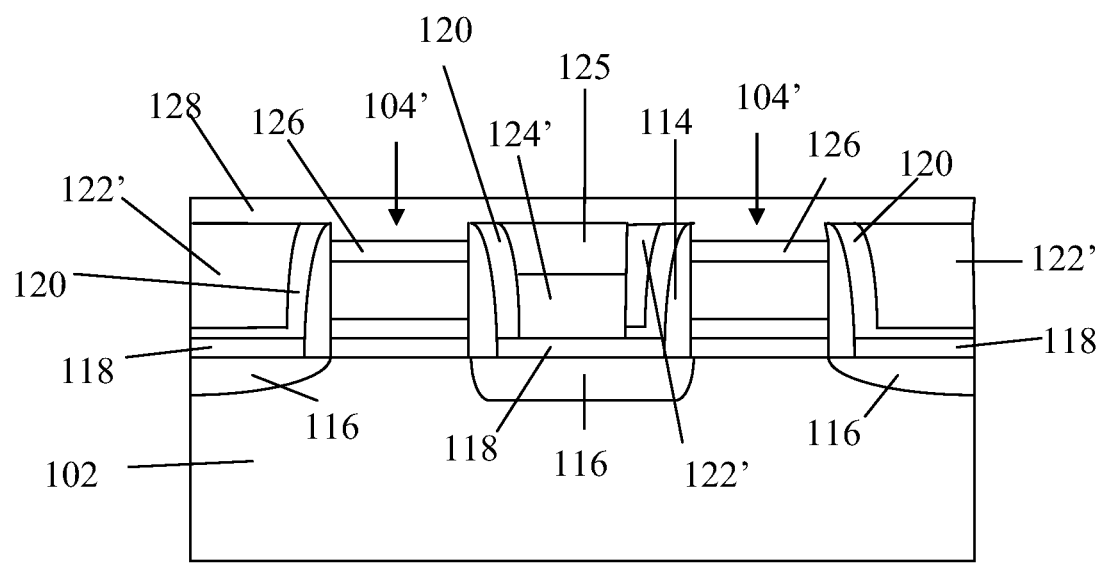
FIG. 28 is a pictorial representation (through a cross sectional view) depicting the structure of FIG. 27 after hard mask deposition and planarization.

Referring to FIG. 28, there is shown the structure of FIG. 27 after formation of another hard mask 128 and planarization. The another hard mask 128 includes one of the hard mask materials mentioned above for another hard mask 50. The another hard mask 128 can be formed utilizing one of the above mentioned techniques used in forming the another hard mask 50. The thickness of the another hard mask 128 can be within the thickness range mentioned above for the another hard mask 50.

Figure 29:
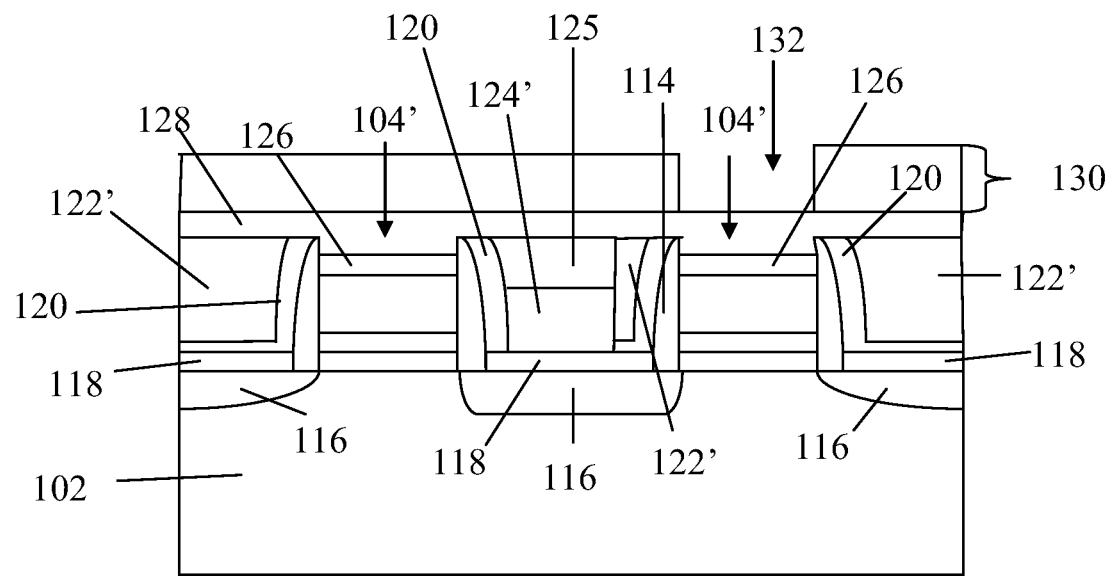
FIG. 29 is a pictorial representation (through a cross sectional view) depicting the structure of FIG. 28 after forming a patterned resist having a gate opening atop the hard mask.

Referring to FIG. 29, there is shown the structure of FIG. 28 after forming a patterned resist 130 having a gate opening 132 atop the another hard mask 128. The patterned resist 130 having the gate opening 132 can be formed using the same materials and techniques mentioned above in regard to providing the patterned resist 52 having gate opening 54 to the structure shown in FIG. 14.

Figure 30:
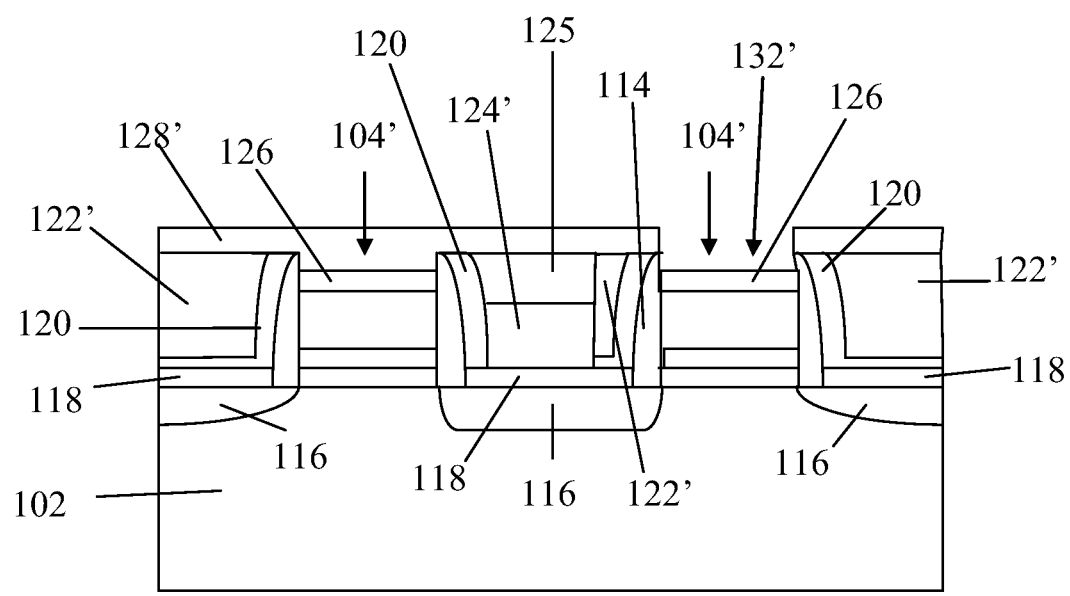
FIG. 30 is a pictorial representation (through a cross sectional view) depicting the structure of FIG. 29 after transferring the gate opening into the hard mask and removing the patterned resist.

Referring to FIG. 30, there is shown the structure of FIG. 29 after transferring the gate opening 132 into the another hard mask 128 and removing the patterned resist 130. The transferring of the gate opening 132 into the another hard mask 128 providing a patterned hard mask 128' having gate opening 132 and subsequent removal of the patterned resist 130 include the same techniques mentioned above for providing the structure shown in FIG. 15.

Figure 31:
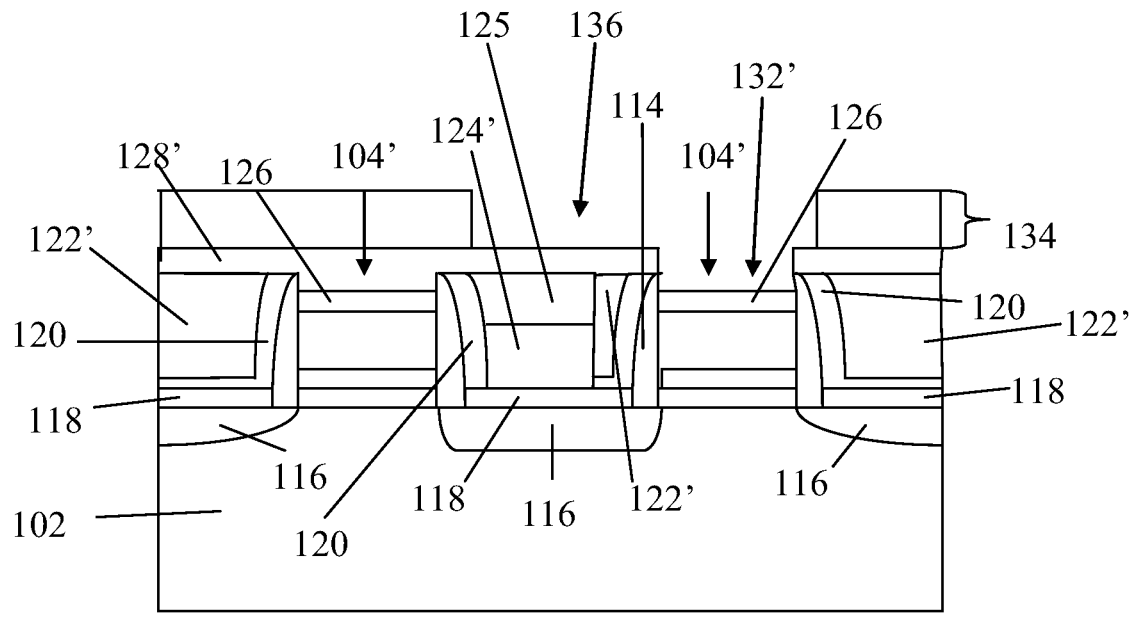
FIG. 31 is a pictorial representation (through a cross sectional view) depicting the structure of FIG. 30 after forming another patterned resist having a line opening atop the patterned hard mask.

Referring to FIG. 31, there is shown the structure of FIG. 30 after forming another patterned resist 134 having a line opening 136 atop the patterned hard mask 128'. This step of the present embodiment is the same as that shown and described above in forming the structure shown in FIG. 16.

Figure 32:
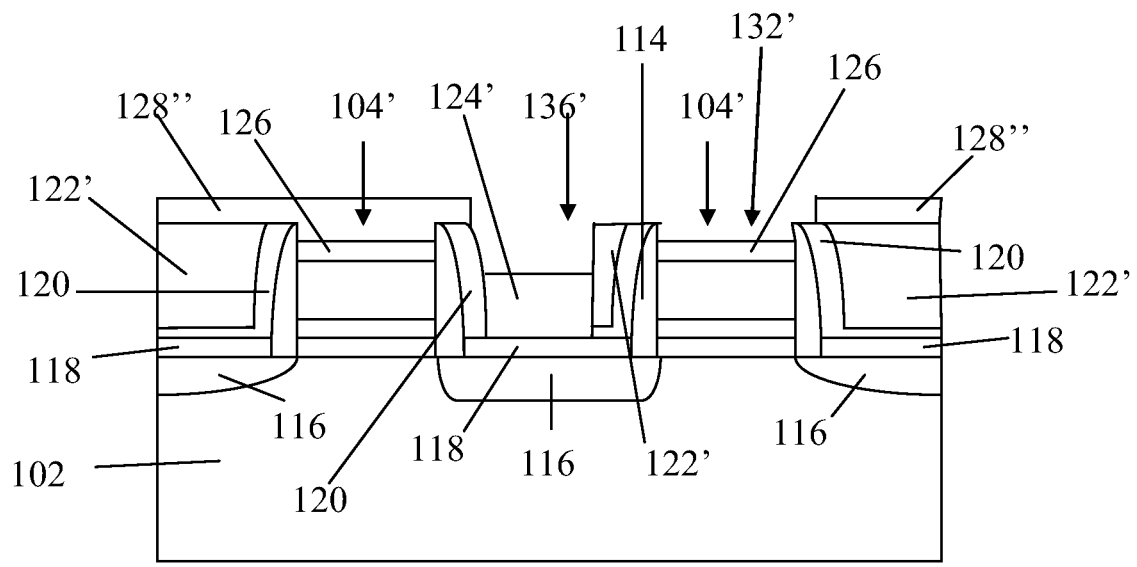
FIG. 32 is a pictorial representation (through a cross sectional view) depicting the structure of FIG. 31 after etching and removal of the another patterned resist having the line opening.

Referring to FIG. 32, there is shown the structure of FIG. 31 after performing etching and removal of the another patterned resist 134 having the line opening 136. The etching step which provides patterned hard mask 128' having a line opening 136' and subsequent removal of the another patterned resist 134 are the same as mentioned above for providing the structure shown in FIG. 17. Note that during this step or in a subsequent etch, the planarized oxide cap 125 is removed from the structure exposing an upper surface of the recessed contact metal 124'.

Figure 33:
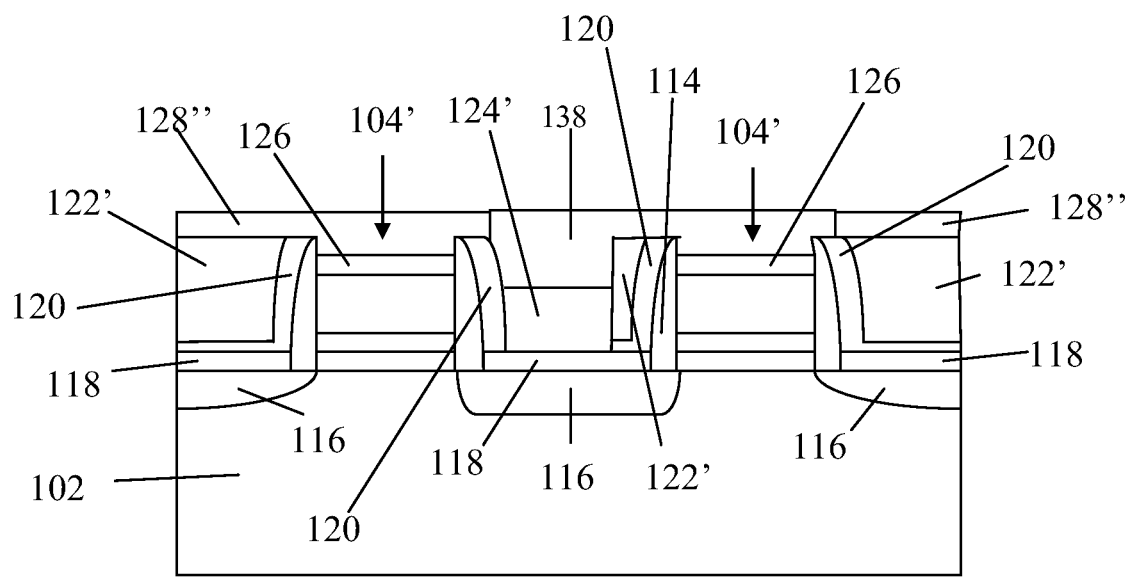
FIG. 33 is a pictorial representation (through a cross sectional view) depicting the structure of FIG. 32 after filling the etched area with another conductive metal layer, and planarization.

Referring to FIG. 33, there is shown the structure of FIG. 32 after filling the etched area with another conductive metal layer 138, and planarization. This step of the present invention includes materials and processes as described above for forming the structure shown in FIG. 18. That is, the another conductive metal layer 138 is equivalent to the another conductive metal layer 60 shown in FIG. 18.

The structure shown in FIG. 33 includes semiconductor substrate 102 having a plurality of gate stacks 104' located on a surface of the semiconductor substrate 102. Each gate stack 104' includes, from bottom to top, a high k gate dielectric layer 106', a work function metal layer 108' and a conductive metal 126. A spacer 114 is located on sidewalls of each gate stack 104' and a self-aligned dielectric liner 120 is present on an upper surface of each spacer 114. A bottom surface of each self-aligned dielectric liner 120 is present on an upper surface of a semiconductor metal alloy 118. A contact metal 124 is located between neighboring patterned gate stacks and is separated from each patterned gate stack by the self-aligned dielectric liner 120. The structure also includes another contact metal 138 having a portion that is located on and in direct contact with an upper surface of the contact metal 124 and another portion that is located on and in direct contact with the conductive metal, i.e., metal silicide 126, of one of the gate stacks.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor structure comprising:
a semiconductor substrate having a plurality of gate stacks located on a surface of the semiconductor substrate, wherein each gate stack comprises a high k gate dielectric layer, a work function metal layer and a conductive metal, wherein said high k gate dielectric layer, said workfunction metal layer and said conductive metal have upper surfaces that are coplanar with each other;
a spacer located on sidewalls of each gate stack, each spacer having a base located entirely on the surface of the semiconductor substrate;
a self-aligned dielectric liner present on an upper surface of each spacer, wherein a bottom surface of each self-aligned dielectric liner is present on an upper surface of a semiconductor metal alloy, and wherein said semiconductor metal alloy has a sidewall portion in contact with an outer edge of said spacer;
a contact metal located between neighboring gate stacks, said contact metal is separated from each patterned gate stack by at least the self-aligned dielectric liner; and
another contact metal having a first portion that is located on and in direct contact with an upper surface of the contact metal and a second portion that is located on and in direct contact with the upper surface of the conductive metal, the upper surface of the workfunction layer and the upper surface of the high k gate dielectric layer of one of the gate stacks.

2. The semiconductor structure of claim 1 wherein said conductive metal is comprised of an elemental metal, an alloy of an elemental metal or a metal silicide.

3. The semiconductor structure of claim 1 wherein said high k gate dielectric is comprised of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, or an alloy thereof, wherein each value of x is independently from 0.5 to 3 and each value of y is independently from 0 to 2.

4. The semiconductor structure of claim 1 wherein said work function metal layer comprises a silicon valence band edge metal.

5. The semiconductor structure of claim 1 wherein said work function metal layer comprises a silicon conduction band edge metal.

6. The semiconductor structure of claim 1 wherein said self-aligned dielectric liner is comprised of a high k dielectric material whose dielectric constant is greater than silicon oxide.

7. The semiconductor structure of claim 6 wherein said high k dielectric material is comprised of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, or an alloy thereof, wherein each value of x is independently from 0.5 to 3 and each value of y is independently from 0 to 2.

8. The semiconductor structure of claim 1 wherein said gate dielectric layer and said work function metal layer are U-shaped.

9. The semiconductor structure of claim 1 further comprising a planarized dielectric material located adjacent each gate stack.

10. The semiconductor structure of claim 1 wherein said contact metal is comprised of W, Al, Cu or alloys thereof.

11. The semiconductor structure of claim 1 wherein said another contact metal is comprised of W, Al, Cu or alloys thereof.

12. The semiconductor structure of claim 1 wherein said metal semiconductor alloy is located above a source region or a drain region of one of said gate stacks.

13. The semiconductor structure of claim 1 wherein said self-aligned dielectric liner has an upper surface that extends above and is offset from an upper surface of the contact metal.

14. The semiconductor structure of claim 1 wherein said contact metal and said another contact metal are comprised of a different material.

* * * * *